United States Patent
Yang

(10) Patent No.: US 7,368,343 B2
(45) Date of Patent: May 6, 2008

(54) LOW LEAKAGE MIM CAPACITOR

(75) Inventor: Sam Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/215,462

(22) Filed: Aug. 9, 2002

(65) Prior Publication Data

US 2002/0192904 A1   Dec. 19, 2002

Related U.S. Application Data

(62) Division of application No. 09/745,114, filed on Dec. 20, 2000.

(51) Int. Cl.
*H01L 21/8234* (2006.01)

(52) U.S. Cl. ............... 438/238; 438/240; 438/250; 438/253; 257/E21.008

(58) Field of Classification Search ............... 438/3, 438/238–256, 381, 386–399; 257/E27.087
See application file for complete search history.

(56) References Cited

U.S. PATENT DOCUMENTS

| | | | |
|---|---|---|---|
| 4,152,490 A | 5/1979 | Witzke | |
| 4,519,851 A | 5/1985 | Perry et al. | 148/286 |
| 4,899,203 A | 2/1990 | Ino | 357/23.6 |
| 4,937,650 A | 6/1990 | Shinriki et al. | |
| 5,034,246 A * | 7/1991 | Mance et al. | 427/126.3 |
| 5,122,923 A | 6/1992 | Matsubara et al. | |
| 5,177,574 A | 1/1993 | Yoneda | 257/306 |
| 5,189,503 A * | 2/1993 | Suguro et al. | 257/310 |
| 5,195,018 A | 3/1993 | Kwon et al. | |
| 5,225,286 A | 7/1993 | Fujikawa et al. | |
| 5,290,609 A | 3/1994 | Horiike et al. | 427/576 |
| 5,335,138 A | 8/1994 | Sandhu et al. | |
| 5,362,632 A | 11/1994 | Mathews | |
| 5,387,480 A | 2/1995 | Haluska | |
| 5,480,748 A | 1/1996 | Bakeman et al. | 430/11 |
| 5,558,961 A | 9/1996 | Doeff et al. | |
| 5,582,312 A | 12/1996 | Niles et al. | |
| 5,589,733 A | 12/1996 | Noda et al. | |
| 5,663,088 A | 9/1997 | Sandhu et al. | 438/396 |

(Continued)

FOREIGN PATENT DOCUMENTS

WO   WO-0041459   7/2000

OTHER PUBLICATIONS

Legore, L..J. , "Controlled Growth of WO3 Films", *J. Vac. Sci. Technol.*, A 15(3),(May 1997),1223-1227.

(Continued)

*Primary Examiner*—H. Jey Tsai
(74) *Attorney, Agent, or Firm*—Schwegman, Lundberg & Woessner, P.A.

(57) ABSTRACT

Capacitor structures for use in integrated circuits and methods of their manufacture. The capacitor structures include a bottom electrode, a top electrode and a dielectric layer interposed between the bottom electrode and the top electrode. The capacitor structures further include a metal oxide buffer layer interposed between the dielectric layer and at least one of the bottom and top electrodes. Each metal oxide buffer layer acts to improve capacitance and reduce capacitor leakage. The capacitors are suited for use as memory cells and apparatus incorporating such memory cells, as well as other integrated circuits.

38 Claims, 17 Drawing Sheets

U.S. PATENT DOCUMENTS

| | | | |
|---|---|---|---|
| 5,686,748 A | 11/1997 | Thakur et al. | 257/310 |
| 5,719,425 A | 2/1998 | Akram et al. | |
| 5,719,607 A | 2/1998 | Hasegawa et al. | |
| 5,741,540 A | 4/1998 | Li et al. | 427/126.3 |
| 5,793,057 A | 8/1998 | Summerfelt | |
| 5,814,852 A | 9/1998 | Sandhu et al. | 257/310 |
| 5,834,357 A | 11/1998 | Kang | |
| 5,838,035 A | 11/1998 | Ramesh | |
| 5,841,186 A | 11/1998 | Sun et al. | |
| 5,851,896 A | 12/1998 | Summerfelt | |
| 5,856,937 A | 1/1999 | Chu et al. | 365/51 |
| 5,859,760 A | 1/1999 | Park et al. | |
| 5,866,460 A | 2/1999 | Akram et al. | |
| 5,867,444 A | 2/1999 | Le et al. | 365/230.06 |
| 5,910,880 A | 6/1999 | DeBoer et al. | |
| 5,916,365 A | 6/1999 | Sherman | 117/92 |
| 5,936,831 A | 8/1999 | Kola et al. | |
| 5,977,581 A | 11/1999 | Thakur et al. | 257/310 |
| 5,981,333 A | 11/1999 | Parekh et al. | |
| 5,981,350 A | 11/1999 | Geusic et al. | |
| 5,985,714 A | 11/1999 | Sandhu et al. | |
| 5,985,732 A | 11/1999 | Fazan et al. | |
| 6,008,086 A | 12/1999 | Schuegraf et al. | 438/255 |
| 6,017,789 A | 1/2000 | Sandhu et al. | 438/240 |
| 6,025,257 A | 2/2000 | Jeon | 438/608 |
| 6,037,235 A | 3/2000 | Narwankar et al. | |
| 6,078,493 A | 6/2000 | Kang | |
| 6,083,765 A * | 7/2000 | Tempel | 438/3 |
| 6,090,697 A | 7/2000 | Xing et al. | |
| 6,124,769 A | 9/2000 | Igarashi et al. | 333/172 |
| 6,165,834 A | 12/2000 | Agarwal et al. | |
| 6,183,255 B1 | 2/2001 | Oshida | 433/201.1 |
| 6,194,227 B1 * | 2/2001 | Hase | 438/3 |
| 6,204,203 B1 | 3/2001 | Narwankar et al. | |
| 6,207,561 B1 | 3/2001 | Hwang et al. | |
| 6,215,650 B1 | 4/2001 | Gnade et al. | |
| 6,218,256 B1 | 4/2001 | Agarwal | |
| 6,235,572 B1 | 5/2001 | Kunitomo et al. | |
| 6,248,640 B1 | 6/2001 | Nam | |
| 6,255,698 B1 | 7/2001 | Gardner et al. | |
| 6,265,260 B1 | 7/2001 | Alers | |
| 6,271,085 B1 | 8/2001 | Yamamoto | |
| 6,284,655 B1 | 9/2001 | Marsh | |
| 6,291,290 B1 | 9/2001 | Arita | |
| 6,294,425 B1 | 9/2001 | Hideki | |
| 6,303,426 B1 | 10/2001 | Alers | |
| 6,303,427 B1 * | 10/2001 | Song et al. | 438/240 |
| 6,320,244 B1 | 11/2001 | Alers et al. | 257/534 |
| 6,339,009 B1 | 1/2002 | Lee et al. | |
| 6,352,865 B2 | 3/2002 | Lee et al. | |
| 6,355,492 B1 * | 3/2002 | Tanaka et al. | 438/3 |
| 6,362,068 B1 | 3/2002 | Summerfelt et al. | |
| 6,387,749 B1 | 5/2002 | Lim | |
| 6,391,801 B1 | 5/2002 | Yang | 438/785 |
| 6,403,415 B1 | 6/2002 | Alers et al. | |
| 6,417,537 B1 | 7/2002 | Yang et al. | 257/310 |
| 6,448,128 B1 | 9/2002 | Lee et al. | |
| 6,451,646 B1 | 9/2002 | Lu et al. | |
| 6,454,914 B1 * | 9/2002 | Nakamura | 204/192.17 |
| 6,475,854 B2 * | 11/2002 | Narwankar et al. | 438/238 |
| 6,475,856 B1 | 11/2002 | Yang | 438/240 |
| 6,524,867 B2 | 2/2003 | Yang et al. | 438/3 |
| 6,541,330 B1 | 4/2003 | Lee et al. | |
| 6,548,368 B1 | 4/2003 | Narwankar et al. | |
| 6,596,583 B2 | 7/2003 | Agarwal et al. | |
| 6,599,807 B2 | 7/2003 | Lim et al. | |
| 6,617,248 B1 | 9/2003 | Yang | 705/54 |
| 6,631,069 B2 | 10/2003 | Yang et al. | 106/462 |
| 7,018,868 B1 | 3/2006 | Yang et al. | |
| 2001/0024387 A1 | 9/2001 | Raaijmakers et al. | 365/200 |
| 2002/0022334 A1 | 2/2002 | Yang et al. | |
| 2002/0036313 A1 | 3/2002 | Yang et al. | 257/306 |
| 2002/0070414 A1 * | 6/2002 | Drescher et al. | 257/410 |
| 2002/0074584 A1 | 6/2002 | Yang | |
| 2002/0164863 A1 | 11/2002 | Murphy | |
| 2005/0167726 A1 * | 8/2005 | Lu et al. | 257/310 |
| 2005/0224897 A1 | 10/2005 | Chen et al. | |
| 2005/0287751 A1 | 12/2005 | Mehrah et al. | |

OTHER PUBLICATIONS

*In: CRC Handbook of Chemistry and Physics, Third Electronic Edition*, (2000), p.12-48-12-56.

Dierks, S., "Material Saftey Data Sheet for Tungsten Oxide", *ESPI Metals Inc.* www.espi-metals.com/msds.htm, (Jun. 1994).

"High Dielectric Constant Materials for DRAMs: Tantalum Oxide", *Time Domain CVD, Chart Listing Dielectric Constants of SiO2, Si3N4, Ta2O5, BST*, http://www.timedomaincvd.com/CVD_fundamentals/films/Ta2O5.html, 3 pages.

"U.S. Appl. No. 09/745,114 Final Office Action mailed Mar. 19, 2003", 52 pgs.

"U.S. Appl. No. 09/745,114 Final Office Action mailed Oct. 12, 2006", 8 pgs.

"U.S. Appl. No. 09/745,114 Non Final Office Action mailed Mar. 31, 2006", 18 pgs.

"U.S. Appl. No. 09/745,114 Non Final Office Action mailed Aug. 28, 2002", 51 pgs.

"U.S. Appl. No. 09/745,114 Non Final Office Action mailed Dec. 16, 2003", 16 pgs.

"U.S. Appl. No. 09/745,114 Notice of Allowance mailed Mar. 27, 2007", 8 pgs.

"U.S. Appl. No. 09/745,114 Notice of Allowance mailed Apr. 27, 2004", 8 pgs.

"U.S. Appl. No. 09/745,114 Notice of Allowance mailed Jun. 14, 2005", 5 pgs.

"U.S. Appl. No. 09/745,114 Notice of Allowance mailed Jul. 22, 2003", 5 pgs.

"U.S. Appl. No. 09/745,114 Notice of Allowance mailed Aug. 28, 2007", NOAR,6 pgs.

"U.S. Appl. No. 09/745,114 Notice of Allowance mailed Sep. 24, 2004", 6 pgs.

"U.S. Appl. No. 09/745,114 Response filed Jan. 02, 2007 to Final Office Action mailed Oct. 12, 2006", 23 pgs.

"U.S. Appl. No. 09/745,114 Response filed Mar. 16, 2004 to Non Final Office Action mailed Dec. 16, 2003", 27 pgs.

"U.S. Appl. No. 09/745,114 Response filed Jun. 19, 2003 to Final Office Action mailed Mar. 19, 2003", 105 pgs.

"U.S. Appl. No. 09/745,114 Response filed Jun. 30, 2006 to Non Final Office Action mailed Mar. 31, 2006", 30 pgs.

"U.S. Appl. No. 09/745,114 Response filed Dec. 30, 2002 to Non Final Office Action mailed Aug. 28, 2002", 27 pgs.

US 6,882,028, 04/2005, Yang (withdrawn)

* cited by examiner

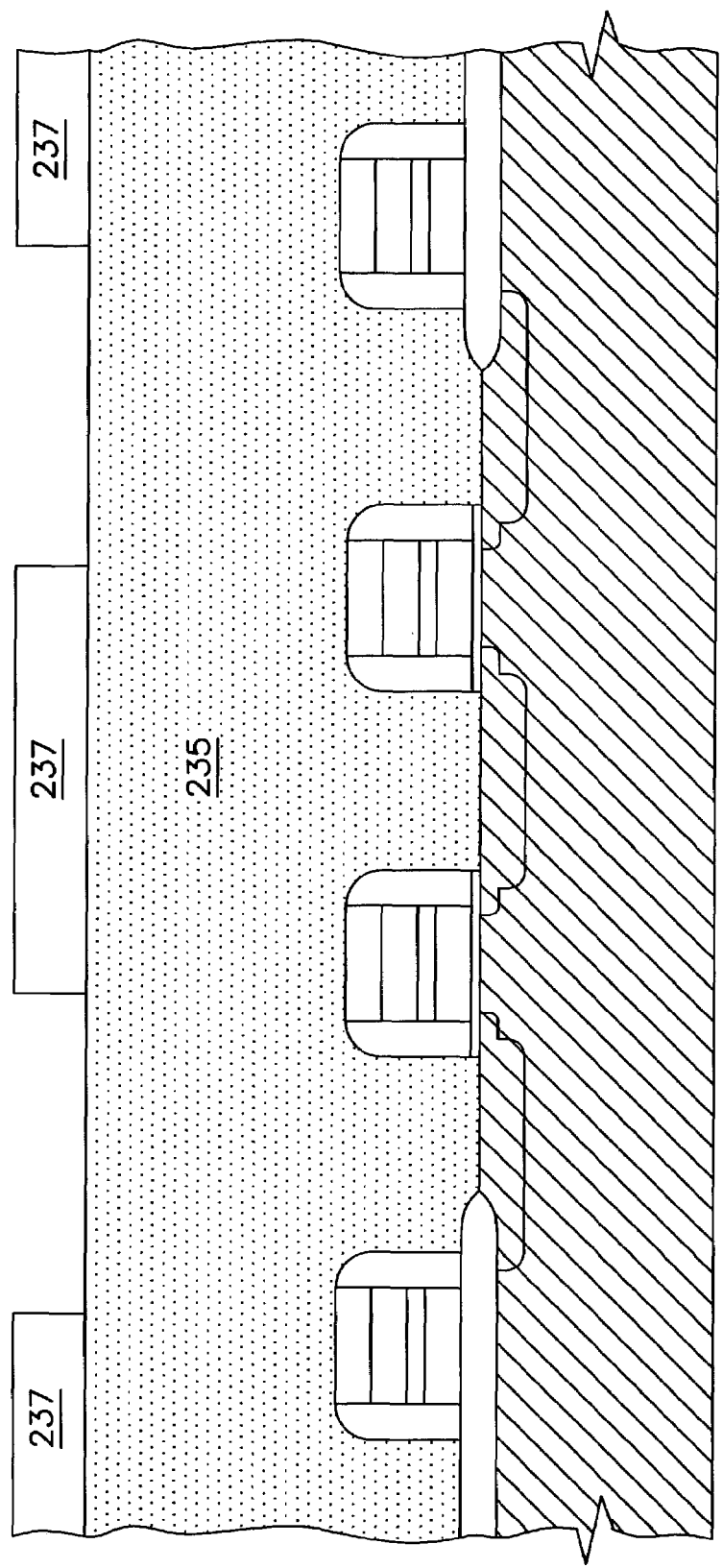

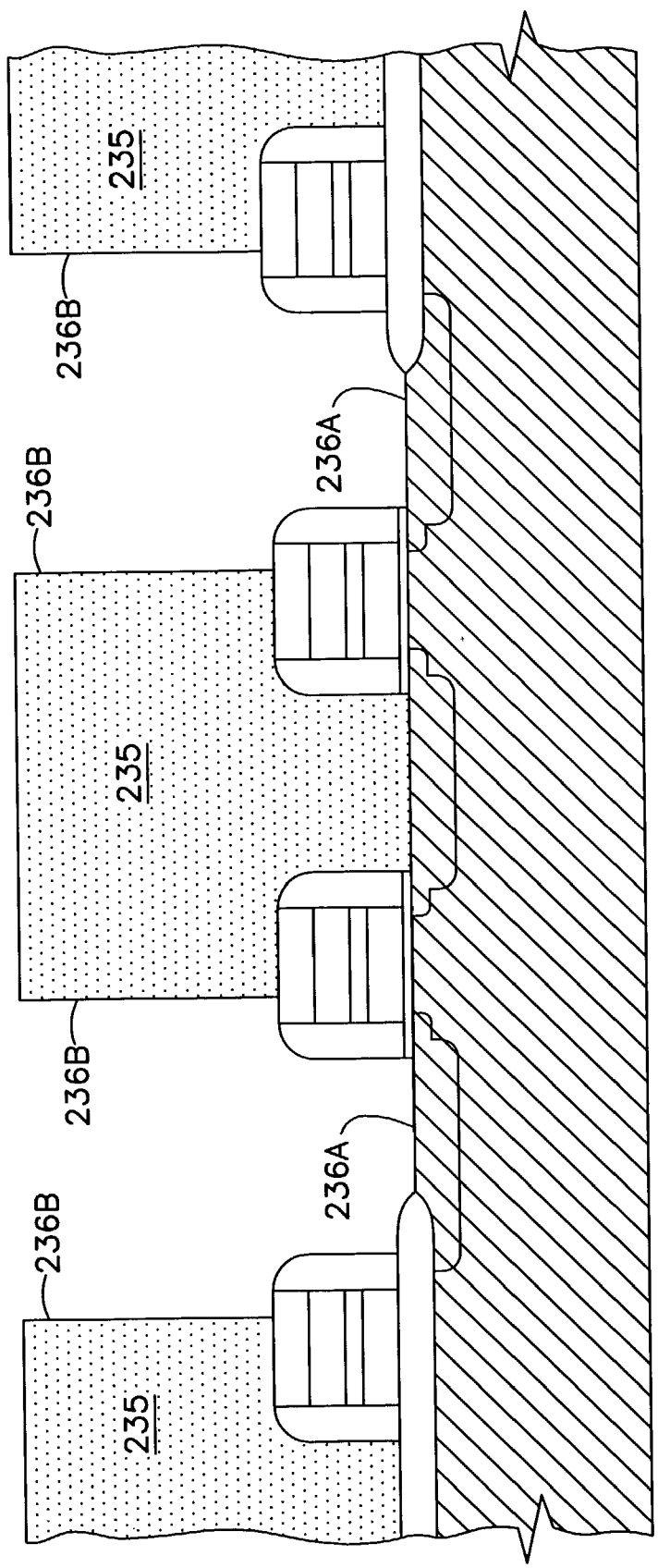

◇ 1150-02 (NO N2 ANNEAL, AS-FORMED)
□ 1150-02 (POST H2 ALLOY)
+ 1150-04 (550C N2 AS-FORMED)
▲ 1150-04 (POST H2 ALLOY)
○ 1150-08 (750C N2, AS-FORMED)
● 1150-08 (POST H2 ALLOY)

LOW LEAKAGE MIM CAPACITOR

This application is a Divisional of U.S. application Ser. No. 09/745,114, filed Dec. 20, 2000 which is incorporated herein by reference.

TECHNICAL FIELD

The present invention relates generally to metal-insulator-metal semiconductor capacitors, and in particular to development of semiconductor capacitor structures having a buffer layer, and apparatus including such capacitor structures.

BACKGROUND

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor typically includes two conductive electrodes separated by a dielectric layer. The charge stored across the capacitor is representative of a data bit and can be either a high voltage or a low voltage. Data is stored in the memory cells during a write mode and retrieved from the memory cells during a read mode. The data is transmitted on signal lines, sometimes referred to as digit lines, which are coupled to input/output (I/O) lines through transistors used as switching devices. Typically, for each bit of data stored, its true logic state is available on an I/O line and its complementary logic state is available on an I/O complement line. However, each such memory cell is coupled to, or associated with, only one digit line of a digit line pair through an access transistor.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected, or addressed. The address for the selected cell is represented by input signals to a word line or row decoder and to a digit line or column decoder. The row decoder activates a word line in response to the word line address. The selected word line activates the access transistors for each of the memory cells in communication with the selected word line. The column decoder selects a digit line pair in response to the digit line address. For a read operation, the selected word line activates the access transistors for a given word line address, the charge of the selected memory cells, i.e. the charge stored in the associated capacitor, are shared with their associated digit lines, and data is sensed and latched to the digit line pairs.

As DRAMs increase in memory cell density by decreasing memory cell area, there is an ongoing challenge to maintain sufficiently high storage capacitance despite decreasing memory cell area and its accompanying capacitor area, since capacitance is generally a function of electrode area. Additionally, there is a continuing goal to further decrease memory cell area.

A principal method of increasing cell capacitance is through cell structure techniques. Such techniques include three-dimensional cell capacitors, such as trenched or stacked capacitors. One common form of stacked capacitor structure is a cylindrical container stacked capacitor, with a container structure forming the bottom electrode of the capacitor. Such container structures may have shapes differing from a substantially cylindrical form, such as an oval or other three-dimensional container. The container structures may further incorporate fins.

Another method of increasing cell capacitance is through the use of high dielectric constant material in the dielectric layer of the capacitor. In order to achieve the charge storage efficiency generally needed in 256 megabit(Mb) memories and above, materials having a high dielectric constant, and typically dielectric constants greater than 20, can be used in the dielectric layer between the bottom electrode and the top electrode of the capacitor. The dielectric constant is a characteristic value of a material and is generally defined as the ratio of the amount of charge that can be stored in the material when it is interposed between two electrodes relative to the charge that can be stored when the two electrodes are separated by a vacuum.

Unfortunately, high dielectric constant materials are often incompatible with existing processes. One cause of such incompatibility can be adverse chemical reactions or oxygen diffusion between the material of the dielectric layer and the material of an adjoining electrode due to direct contact.

For the reasons stated above, and for other reasons which will become apparent to those skilled in the art upon reading and understanding the present specification, there is a need in the art for alternative capacitor structures and methods for producing same.

SUMMARY

The above mentioned problems with capacitors and associated memory devices, and other problems are addressed by the present invention and will be understood by reading and studying the following specification.

Embodiments of the invention include capacitors having a metal oxide buffer layer interposed between an electrode and a dielectric layer, and methods of their formation. The metal oxide buffer layer acts to reduce undesirable charge leakage from the capacitor.

For one embodiment, the invention includes a capacitor. The capacitor includes two electrodes and a dielectric layer interposed therebetween. The capacitor further includes a metal oxide buffer layer interposed between the dielectric layer and one of the electrodes.

For one embodiment, the bottom electrode, the top electrode or both electrodes contain metal nitride. For another embodiment, the dielectric layer contains at least one metal oxide dielectric material. For yet another embodiment, the metal oxide buffer layer contains a metal oxide having a composition of the form $MO_x$. The metal component M may be a refractory metal. In one embodiment of the invention, the refractory metal is tungsten (W). In one embodiment, the electrode adjacent the buffer layer also includes tungsten. In another embodiment of the invention, the dielectric layer is a metal oxide.

For another embodiment, the invention includes a method of forming a capacitor. The method includes forming a metal oxide buffer layer adjacent of the electrode layers. In one embodiment, the method includes forming a first electrode layer, forming the metal oxide buffer layer adjacent on the first electrode layer, forming a dielectric layer on the metal oxide buffer layer, and forming a second electrode layer on the dielectric layer. In one embodiment of the invention, the method includes oxidizing the first electrode to form a thin metal oxide buffer layer. In another embodiment of the invention, the thin buffer layer is annealed to further reduce capacitor leakage. In another embodiment of the invention, the anneal temperature of the buffer layer is about 700 degrees. In another embodiment, the buffer layer is annealed for about one minute.

Further embodiments of the invention include semiconductor structures and methods of varying scope, as well as apparatus, devices, modules and systems making use of such semiconductor structures and methods.

BRIEF DESCRIPTION OF DRAWINGS

FIGS. 2A-2I are cross-sectional views of a portion of the memory device of FIG. 1 at various processing stages according to the teachings of the present invention.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both wafer and substrate are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures known to one skilled in the art. Furthermore, when reference is made to a wafer or substrate in the following description, previous process steps may have been utilized to form regions/junctions on the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

The following description will be illustrated in the context of semiconductor container capacitors, and in particular, container capacitor memory cells for dynamic memory devices. It will be apparent to those skilled in the art that other capacitor structures, e.g., trench capacitors and parallel plate capacitors, are suitable for use with the various embodiments of the invention. It will further be apparent to those skilled in the art that the capacitor structures described herein and their methods of fabrication can be adapted to a variety of integrated circuit devices and applications, some of which may be apart from memory devices. Accordingly, the structures of the present invention described herein are not limited to the example embodiments.

Figure 1:
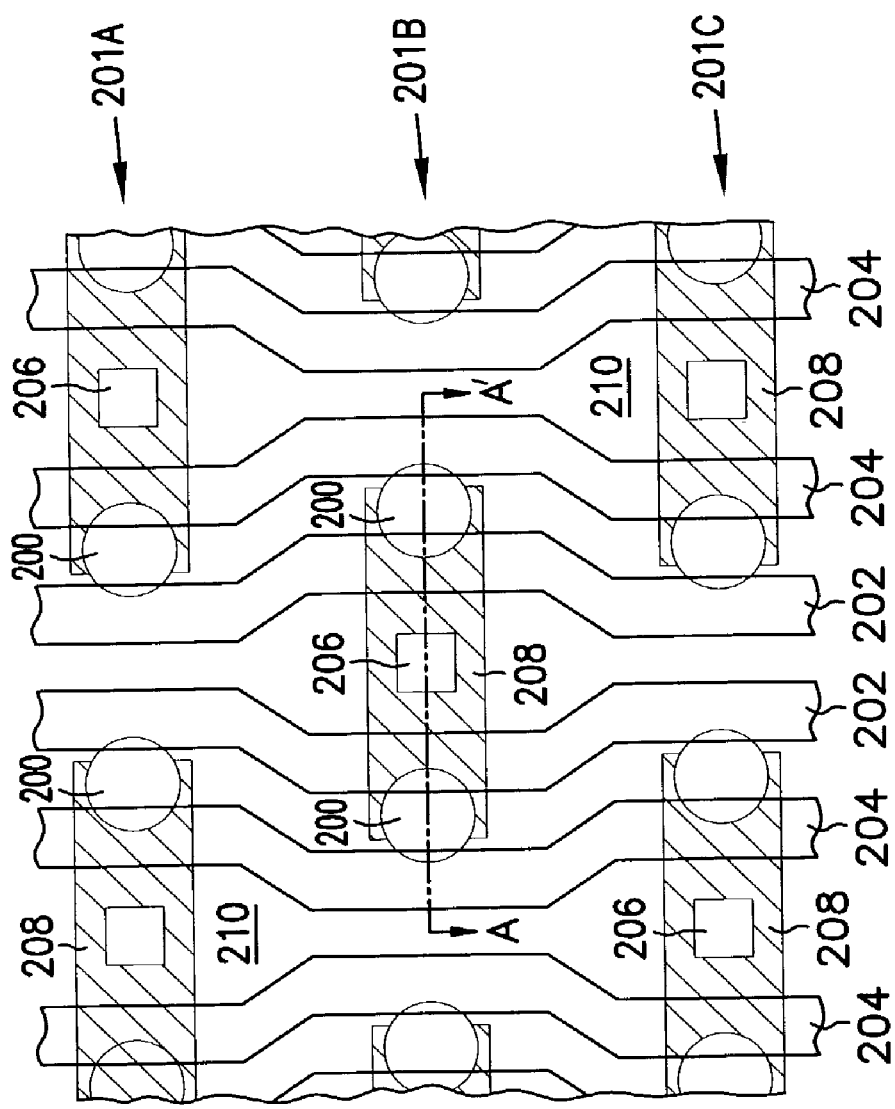
FIG. 1 is an elevation view of a layout of a portion of a memory array of a memory device according to the teachings of the present invention.

FIG. 1 depicts the general layout of a portion of a memory array of a memory device in accordance with one embodiment of the invention. The memory array includes container capacitor memory cells 200 formed overlying active areas 208. Active areas 208 are separated by field isolation regions 210. Active areas 208 and field isolation regions 210 are formed overlying a semiconductor substrate.

The memory cells 200 are arrayed substantially in rows and columns. Shown in FIG. 1 are portions of three rows 201A, 201B and 201C, collectively 201. Separate digit lines (not shown) would be formed overlying each row 201 and coupled to active areas 208 through digit line contacts 206. Word lines 202 and 204 are further coupled to active areas 208, with word lines 202 coupled to active areas 208 in row 201B and word lines 204 coupled to active areas 208 in rows 201A and 201C. The word lines 202 and 204, coupled to memory cells in this alternating fashion, generally define the columns of the memory array. This folded bit-line architecture is known to one of ordinary skill for permitting higher densities of memory cells 200 on a substrate.

FIGS. 2A-2I depict one embodiment of a portion of the processing to fabricate the memory device of FIG. 1. FIGS. 2A-2I are cross-sectional views taken along line A-A' of FIG. 1 during various processing stages.

Figure 2A:
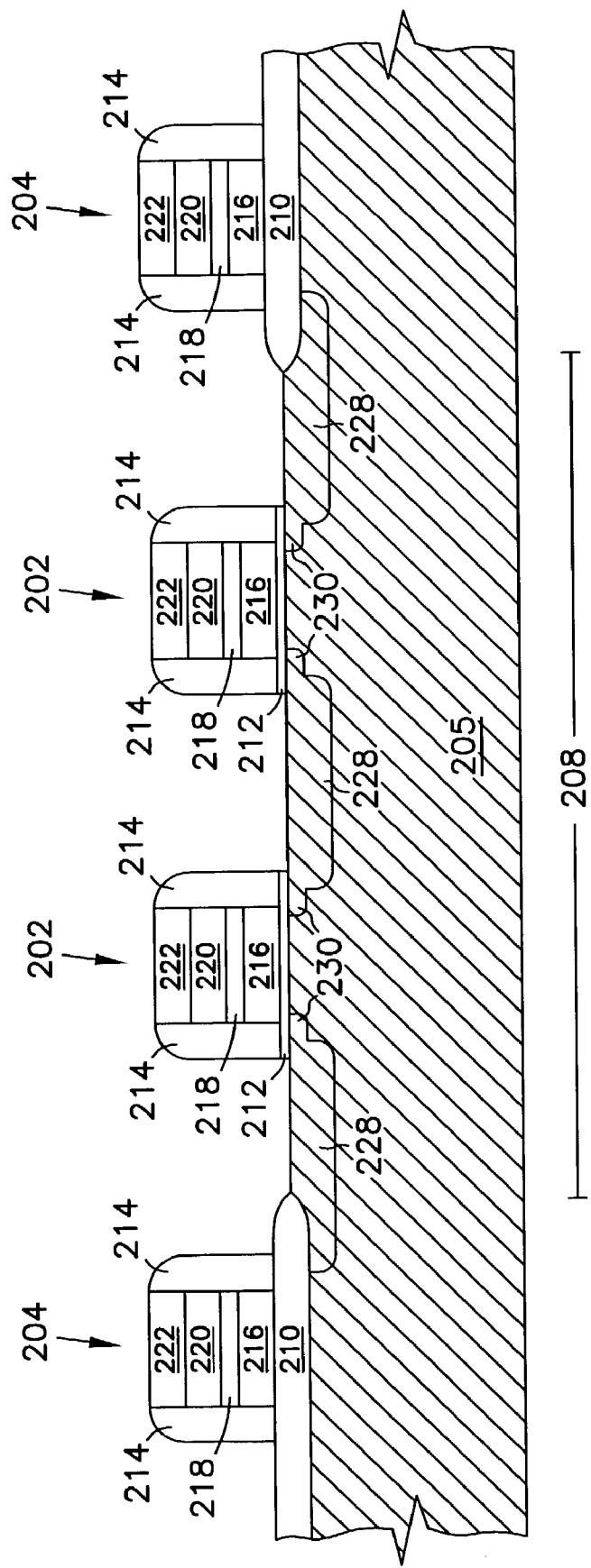

In FIG. 2A, field isolation regions 210 are formed on a substrate 205. Substrate 205 may be a silicon substrate, such as a P-type silicon substrate. Field isolation regions 210 are generally formed of an insulator material, such as silicon oxides, silicon nitrides or silicon oxynitrides. For this embodiment, field isolation regions 210 are formed of silicon dioxide such as by conventional local oxidation of silicon (LOCOS) which creates substantially planar regions of oxide on the substrate surface. Active areas 208 are those areas not covered by the field isolation regions 210 on substrate 205. The creation of the field isolation regions 210 is preceded or followed by the formation of a gate dielectric layer 212. For this embodiment, gate dielectric layer 212 is a thermally grown silicon dioxide, but may be other insulator materials described herein or known in the art.

Following the creation of the field isolation regions 210 and gate dielectric layer 212, a first conductively doped gate polysilicon layer 216, a gate barrier layer 218, a gate conductor layer 220, a gate cap layer 222 and gate spacers 214 are formed by methods known in the art. Gate barrier layer 218 may be a metal nitride, such as titanium nitride or tungsten nitride. Gate conductor layer 220 may be any conductive material, for example a metal. Gate cap layer 222 is often silicon nitride while gate spacers 214 are generally of an insulator material such as silicon oxide, silicon nitride and silicon oxynitride. The foregoing layers are patterned to form word lines 202 and 204 as gates for field effect transistors (FET), which FET's are one type of access devices to a data storage unit (capacitor) in a memory cell. The construction of the word lines 202 and 204 are illustrative only. As a further example, the construction of the word lines 202 and 204 may include a refractory metal silicide layer overlying a polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. Other constructions for word lines 202 and 204 are known to those skilled in the art.

Source/drain regions 228 are formed in the substrate 205 such as by conductive doping of the substrate. Source/drain regions have a conductivity opposite the substrate 205. For a P-type substrate, source/drain regions 228 would have an N-type conductivity. Such conductive doping may be accomplished through ion implantation of phosphorus or arsenic for this embodiment. As is often the case, source/drain regions 228 include lightly-doped regions 230 created by differential levels of ion concentration or even differing dopant ions. Word lines 202 and 204 are adapted to be coupled to periphery contacts (not shown). The periphery contacts are located at the end of the memory array and are adapted for electrical communication with external circuitry.

The formation of the word lines 202 and 204 as described are an example of one application to be used in conjunction with various embodiments of the invention. Other methods of fabrication and other applications are also feasible and perhaps equally viable. For clarity and to focus on the formation of the capacitor structures, many of the reference numbers are eliminated from subsequent drawings, e.g., those pertaining to the structure of the word lines and the source/drain regions.

In FIG. 2B, a thick insulating layer 235 is deposited overlying substrate 205, as well as word lines 202 and 204, field isolation regions 210 and active areas 208. Insulating layer 235 is an insulator material such as silicon oxide, silicon nitride and silicon oxynitride materials. For one embodiment, insulating layer 235 is a doped insulator material such as borophosphosilicate glass (BPSG), a boron and phosphorous-doped silicon oxide. It is understood that other insulating materials known to those of skill in the art may be used. The insulating layer 235 is planarized, such as by chemical-mechanical planarization (CMP), in order to provide a uniform height. A mask 237 is formed overlying insulating layer 235 and patterned to define future locations of capacitors.

In FIG. 2C, portions of insulating layer 235 exposed by patterned mask 237 are removed and mask 237 is subsequently removed. The portions of insulating layer 235 may be removed by etching or other suitable removal technique known to those skilled in the art. Removal techniques are generally dependent upon the material of construction of the layer to be removed as well as the surrounding layers to be retained. Patterning of insulating layer 235 creates openings having bottom portions 236A overlying exposed portions of the substrate 205 and sidewalls 236B defined by the insulating layer 235.

Figure 2D:
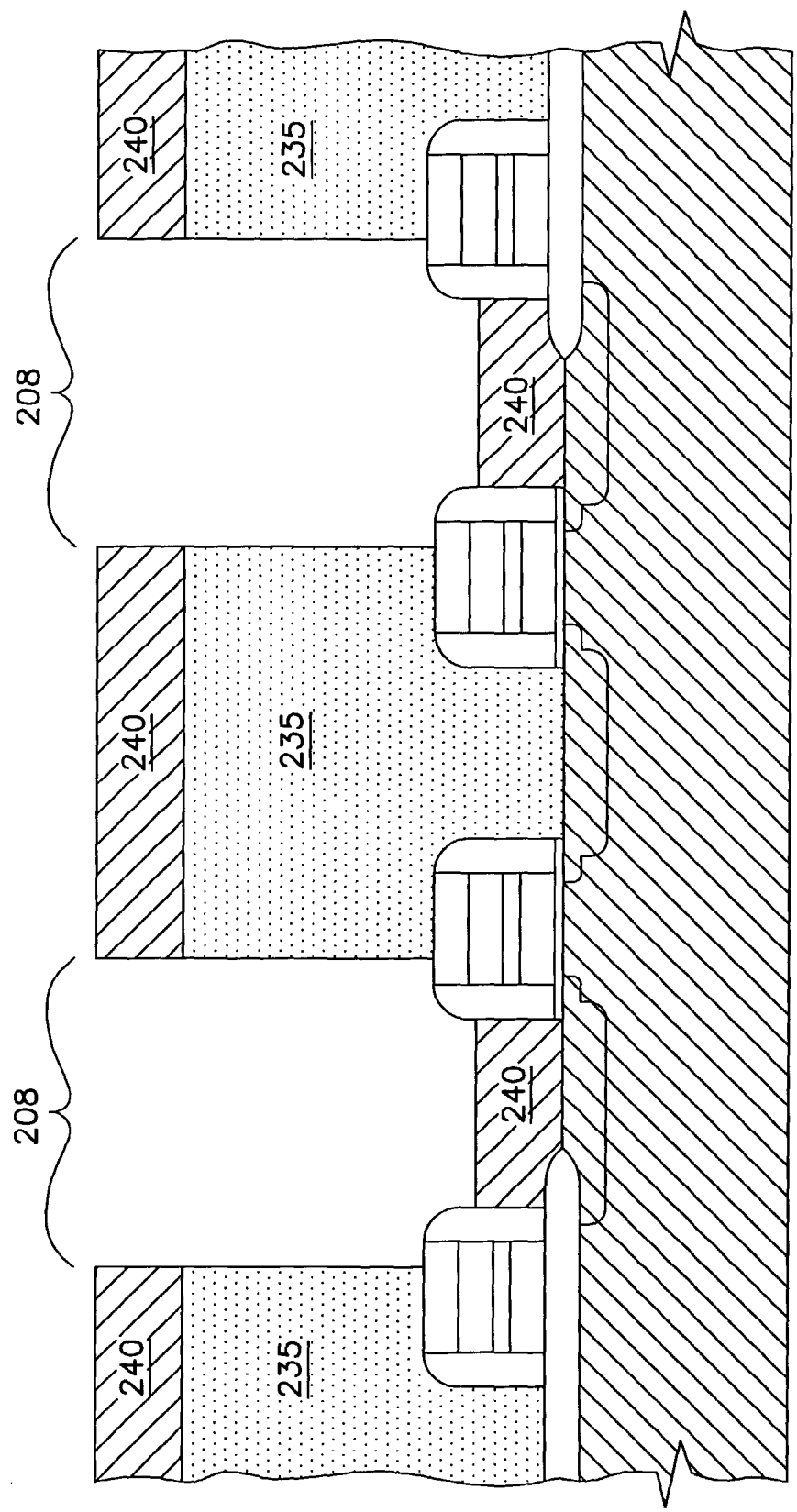

In FIG. 2D, a layer of doped polysilicon is formed overlying exposed portions of active area 208 and top portions of insulating layer 235 to form contact layer 240. Contact layer 240 may be formed by controlled deposition of polysilicon as shown in FIG. 2D. Alternatively, contact layer 240 may be blanket deposited polysilicon followed by an etch-back to leave a layer of polysilicon overlying exposed portions of active area 208 between word lines 202 and 204. For still further embodiments, contact layer 240 is formed from tungsten, titanium nitride, tungsten nitrides, tantalum nitride, aluminum or other conductive materials, metals or alloys.

Figure 2E:
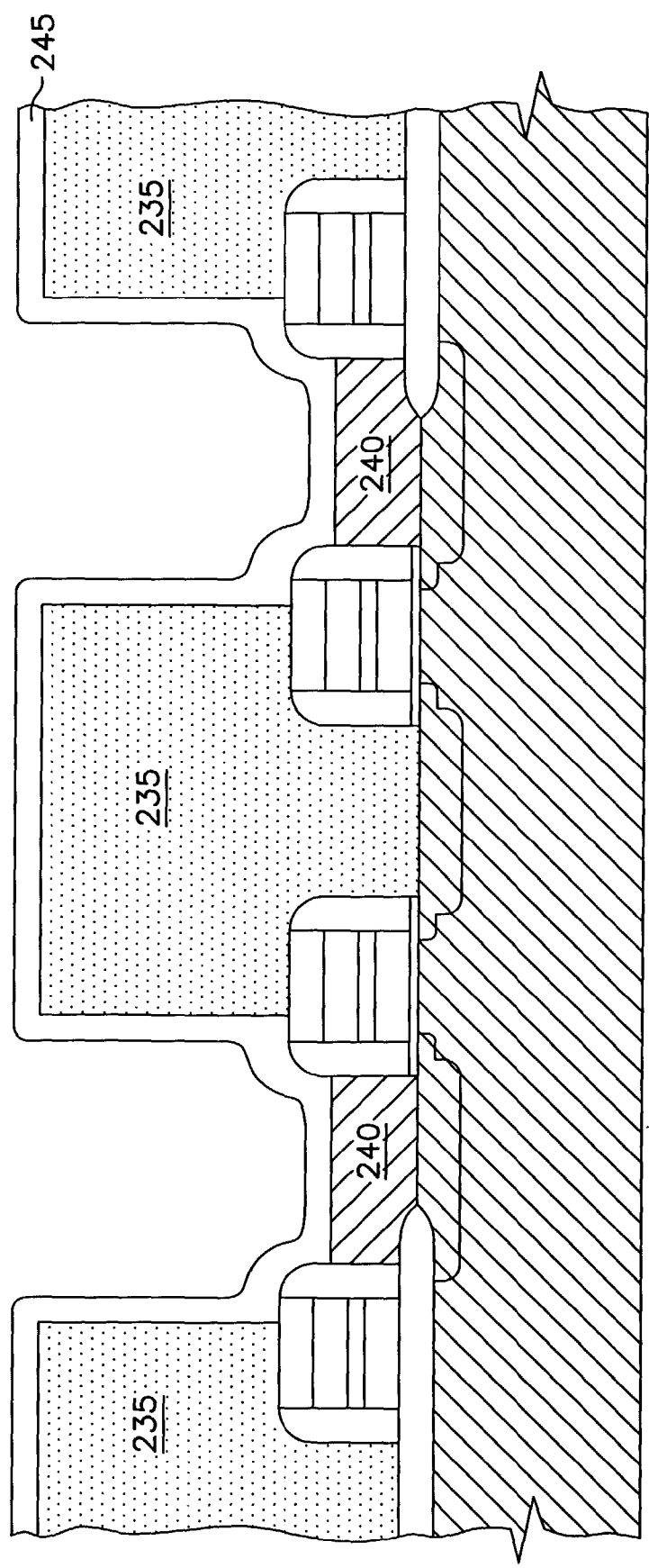

In FIG. 2E, the portions of contact layer 240 overlying insulating layer 235 are removed leaving contacts 240 between the word lines 202 and 204. A bottom electrode 245 is formed overlying the contacts 240 and insulating layer 235. Bottom electrode 245 is any conductive material. For one embodiment, bottom electrode 245 contains a metal nitride. For another embodiment, the metal component of the bottom electrode 245 is a refractory metal, resulting in a refractory metal nitride. For yet another embodiment, bottom electrode 245 contains tungsten nitride ($WN_n$; $0<n<=6$).

Bottom electrode 245 may be formed by any method, such as collimated sputtering, chemical vapor deposition (CVD) or other deposition techniques. In the case of a metal nitride material, bottom electrode 245 may be deposited as a metal layer followed by nitridation.

Bottom electrode 245 forms the bottom conductive layer or electrode of the capacitor. For one embodiment, the bottom conductive layer has a closed bottom and sidewalls extending up from the closed bottom as shown in FIG. 2E. For another embodiment, the bottom conductive layer has a substantially planar surface as in a parallel plate capacitor. Bottom electrode 245 may contain more than one conductive layer, e.g., a metal nitride layer overlying a metal silicide layer. Subsequent annealing of the memory device may produce a reaction between bottom electrode 245 and contact 240 such that an interface layer is formed. As an example, where bottom electrode 245 contains a refractory metal or refractory metal nitride, and contact 240 contains polysilicon, subsequent annealing can produce a refractory metal silicide interface between bottom electrode 245 and contact 240. Such metal silicide interface layers are often advantageous in reducing electrical resistance to contact 240.

Figure 2F:
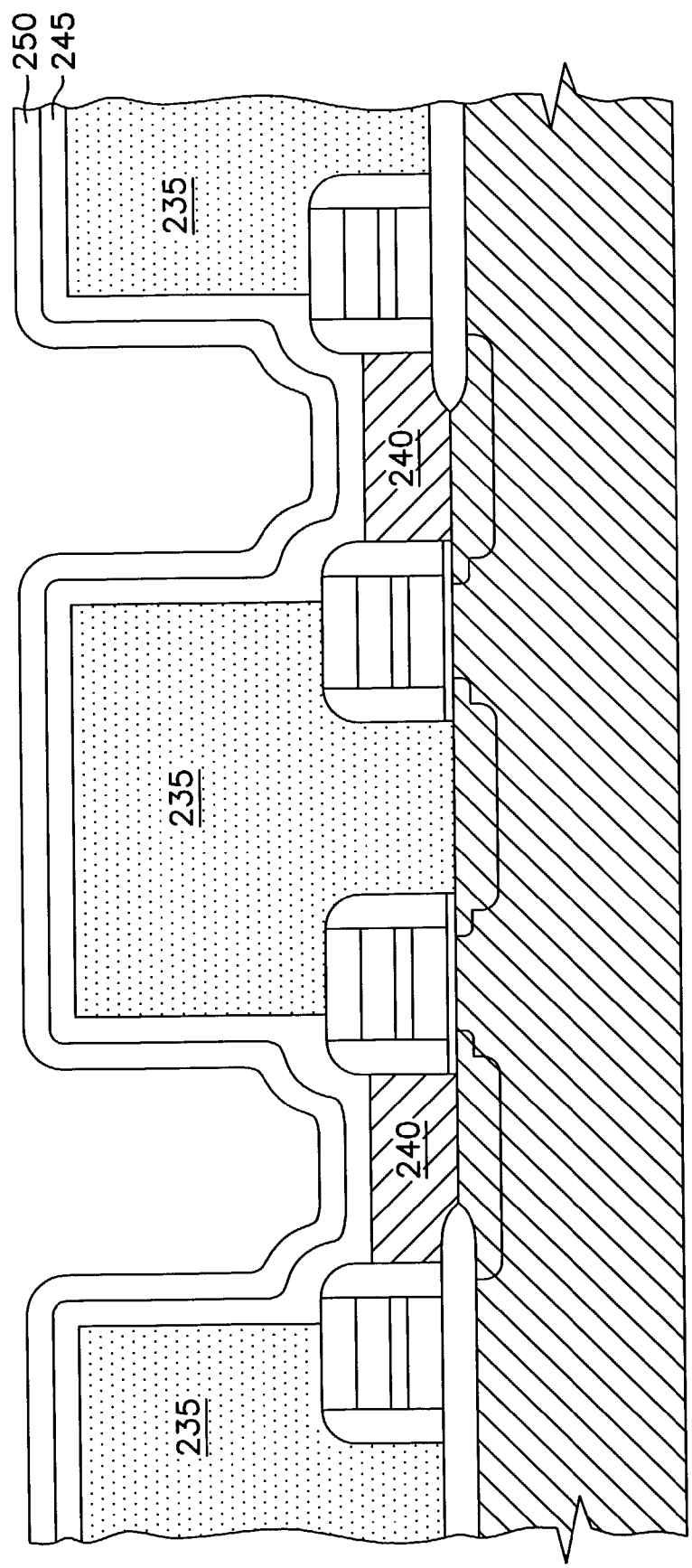

In FIG. 2F, a buffer layer 250 is formed overlying bottom electrode 245. The buffer layer 250 is shown to be directly adjoining bottom electrode 245. But buffer layer 250 is not shown to scale relative to bottom electrode 245 for convenience and clarity of illustration. Buffer layer 250 is a metal oxide material having a composition of the form $MO_x$. In one embodiment, the metal component M is a refractory metal. The refractory metals of chromium (Cr), cobalt (Co), hafnium (Hf), molybdenum (Mo), niobium (Nb), tantalum (Ta), titanium (Ti), tungsten (W), vanadium (V) and zirconium (Zr) are included in this definition. For one embodiment, buffer layer 250 contains a tungsten oxide material ($WO_x$). Metal oxide buffer layers can act to reduce capacitor leakage.

Benefits may be derived by matching the metal oxide buffer layer to the adjacent metal nitride electrode. For example, the $WO_x$ buffer layer 250 can be grown by oxidizing the $WN_x$ bottom electrode layer 245. Accordingly, the metal component of the metal oxide buffer layer 250 and the metal component of the metal nitride of bottom electrode 245 are both tungsten. Such matching of the buffer layer to the electrode can be utilized to reduce stress between the two layers, thus improving device reliability. Furthermore, such matching allows formation of bottom electrode 245 and buffer layer 250 using a single deposition process along with an oxidation process.

For one embodiment, buffer layer 250 is formed from the bottom electrode 245 containing metal nitride. For this embodiment, the metal nitride of the bottom electrode 245 is oxidized to form the metal oxide. Such oxidation may use a variety of techniques including oxidation in an ambient containing $O_2$ or ozone ($O_3$), with or without the help of plasma, or UV light or remote plasma. Controlled oxidation of the metal nitride can be used to form the metal oxide buffer layer 250, at the upper, exposed surface of bottom electrode 245. For a further embodiment, buffer layer 250 is grown by oxidizing a $WN_x$ bottom electrode 245 in an oxygen-containing ambient thereby using tungsten at the surface of the bottom electrode to grow a $WO_3$ buffer layer.

In one embodiment, the buffer layer 250 is grown in an $O_2$ or $O_3$ ambient at a temperature in the range of 300 to 550 degrees Celsius. The buffer layer 250 may be grown with or without a plasma in the environment. The bottom electrode 245 now includes $W_2N$ film adjacent the $WO_3$ buffer layer 250 due to the oxidation process.

In one embodiment, buffer layer 250, bottom electrode 245 and substrate are annealed at a temperature of at least 700 degrees Celsius in an inert gas ambient. The inert gases include, but are not limited to, $N_2$, Ar, or He. The buffer layer is believed to have an orthorhomic crystalline structure due to the high temperature anneal.

Figure 2G:
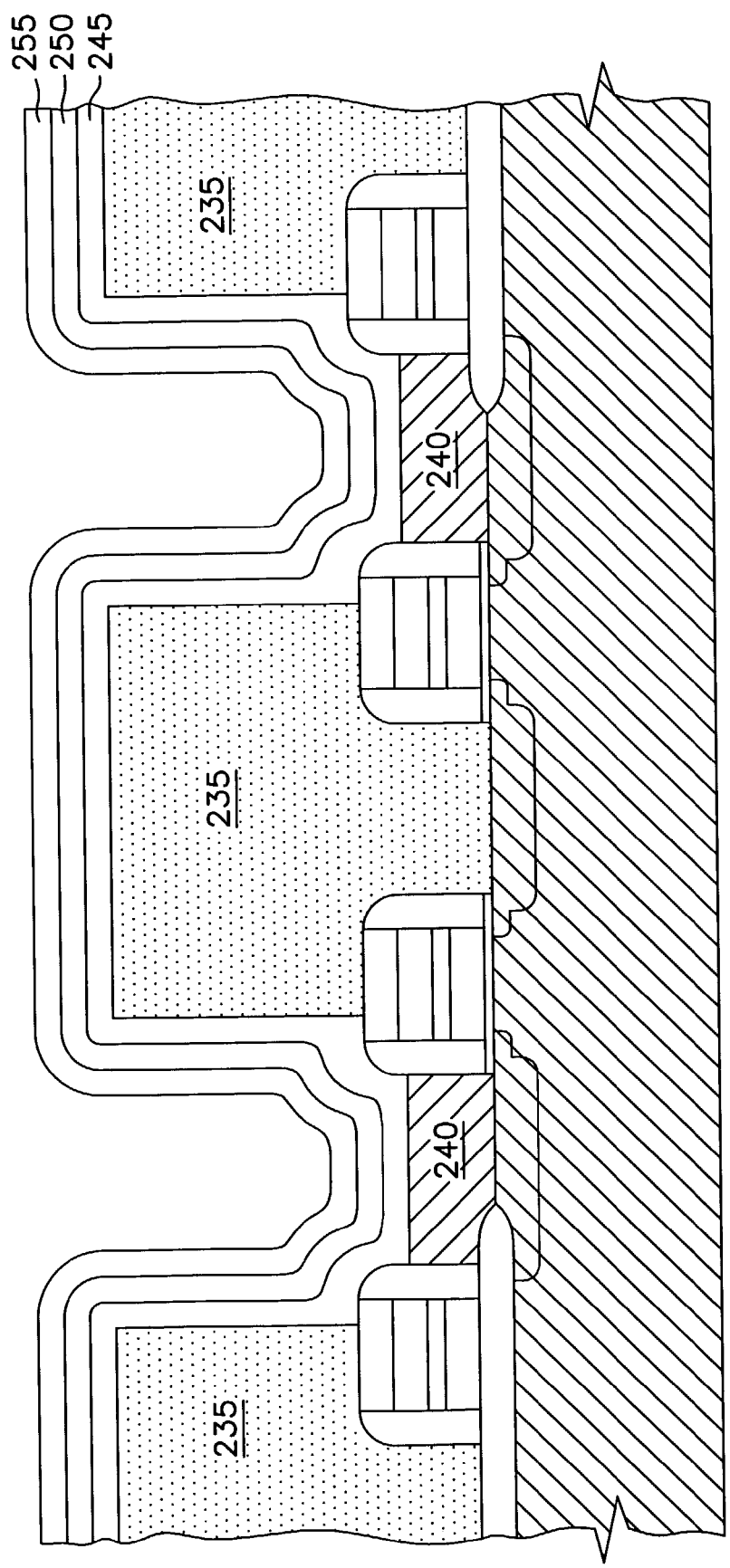

In FIG. 2G, a dielectric layer 255 is formed overlying buffer layer 250. The dielectric layer 255 is shown to be adjoining buffer layer 250, but there is no prohibition to forming additional layers interposed between dielectric layer 255 and buffer layer 250 as same may be suitable in some applications of the present invention. Note, however, that the nature of any additional layer may adversely affect performance of the resulting capacitor such as creating an undesirable series capacitance.

Dielectric layer 255 contains a dielectric material. For one embodiment, dielectric layer 255 contains at least one metal oxide dielectric material. For another embodiment, dielectric layer 255 contains a Tantalum Oxide, such as $Ta_2O_5$. Dielectric layer 255 may be deposited by any deposition technique, e.g., RF-magnetron sputtering, chemical vapor deposition (CVD). As one example, a metal oxide, e.g., tantalum oxide, may be formed by depositing a layer of the metal component, e.g., tantalum, followed by annealing in an oxygen-containing ambient. As another example, the metal oxide may be deposited by metal organic chemical vapor deposition (MOCVD). Subsequent to formation, dielectric layer 255 may be annealed in an oxygen-containing ambient, such as an ambient containing $O_2$ or ozone, at a temperature within the range of approximately 200 to 800° C. The actual oxygen-containing ambient, concentration of oxygen species and annealing temperature may vary for the specific dielectric deposited. These variations are known to those skilled in the art.

Bottom electrode 245 is generally not oxidized, or is only marginally oxidized, during formation or subsequent processing of dielectric layer 255 due to the protection from the oxygen-containing ambient and diffusion of oxygen as provided by buffer layer 250. However, insulators generally create a series capacitance of the buffer layer and the dielectric layer. Such series capacitance can detrimentally impact the overall capacitance of the capacitor structure when the insulative buffer layer has a dielectric constant less than that of the dielectric layer. Accordingly, the buffer layer has a dielectric constant greater than the dielectric constant of the dielectric layer. For example, the $WO_3$ buffer layer has a dielectric constant of about 300 and a $Ta_2O_5$ dielectric layer has a dielectric constant of about 20-25. Accordingly, the dielectric layer determines the capacitance with little detrimental effect, e.g. series capacitance, by the buffer layer.

Figure 2H:
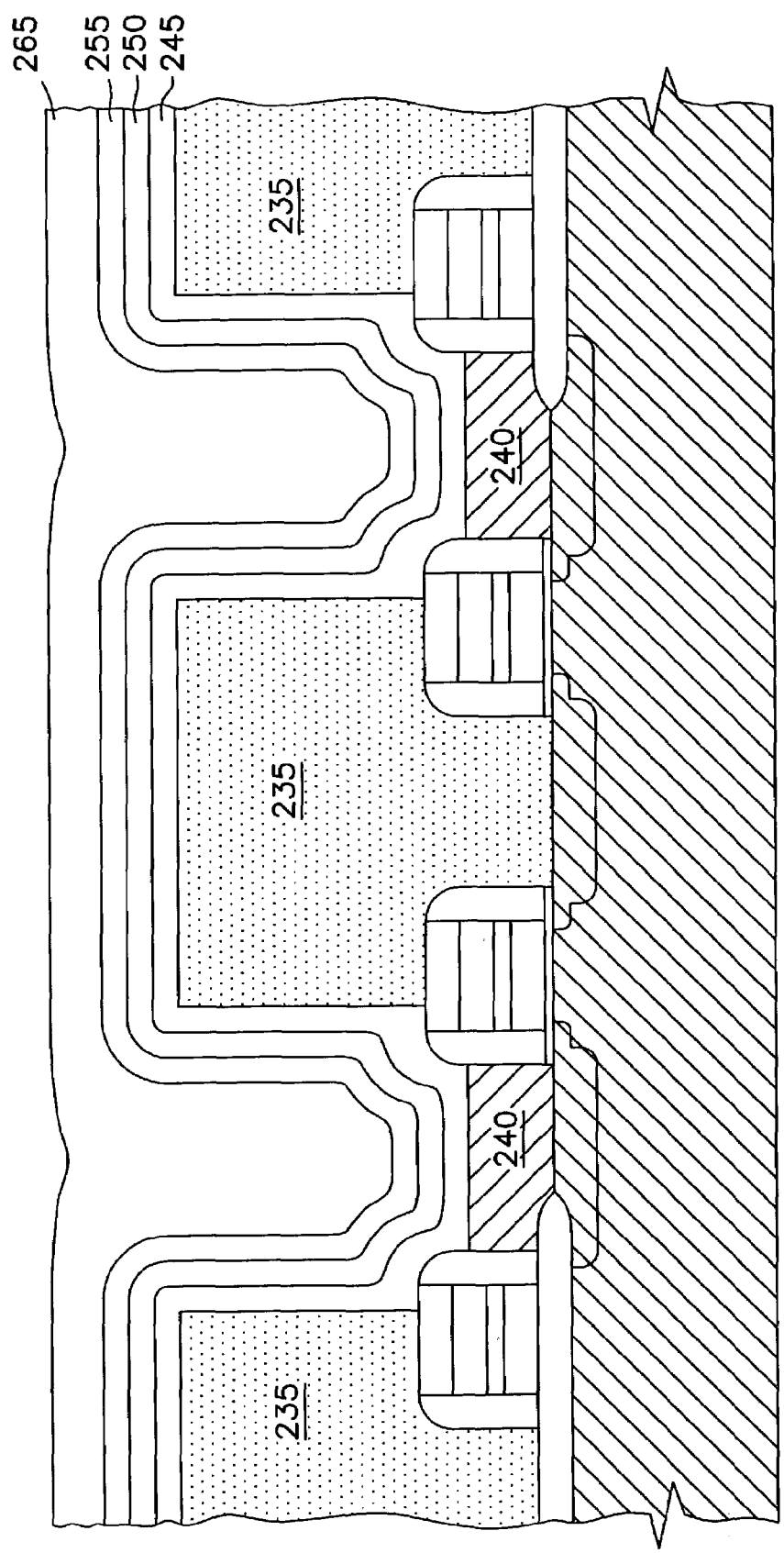

In FIG. 2H, a top electrode 265 is deposited to form the top conductive layer or electrode of the capacitor. The top electrode 265 is shown to be directly adjoining dielectric layer 255, but there is no prohibition to forming additional conductive layers interposed between the top electrode 265 and dielectric layer 255. Top electrode 265 may be of any conductive material and generally follows the same guidelines as bottom electrode 245. For one embodiment, top electrode 265 contains Pt—Rh deposited by CVD. Layers 245 through 270 are then patterned by techniques known in the art to define capacitors of memory cells 200 in FIG. 2I.

In addition, the figures were used to aid the understanding of the accompanying text. However, the figures are not drawn to scale and relative sizing of individual features and layers are not necessarily indicative of the relative dimensions of such individual features or layers in application. As an example, while bottom electrode 245 is drawn to have an illustrated thickness of approximately the same as dielectric layer 255, for purposes of clarity and convenience, bottom electrode 245 may have a physical thickness of five times that of dielectric layer 255 in some applications. In one embodiment, bottom electrode 245 has a thickness of about 200-400 Å. In one embodiment, the buffer layer has a thickness of about 50-150 Å. In one embodiment, the dielectric layer 255 has a thickness of about 60-100 Å. In one embodiment, the top electrode 265 has a thickness of about 200-800 Å. One of ordinary skill in the art will understand upon reading the disclosure the suitable thicknesses of such layers for carrying out the present invention. Accordingly, the drawings are not to be used for dimensional characterization.

While the foregoing embodiments of capacitor structures may be used in a variety of integrated circuit devices, they are particularly suited for use as storage capacitors of memory cells found in dynamic memory devices.

Memory Devices

Figure 3:
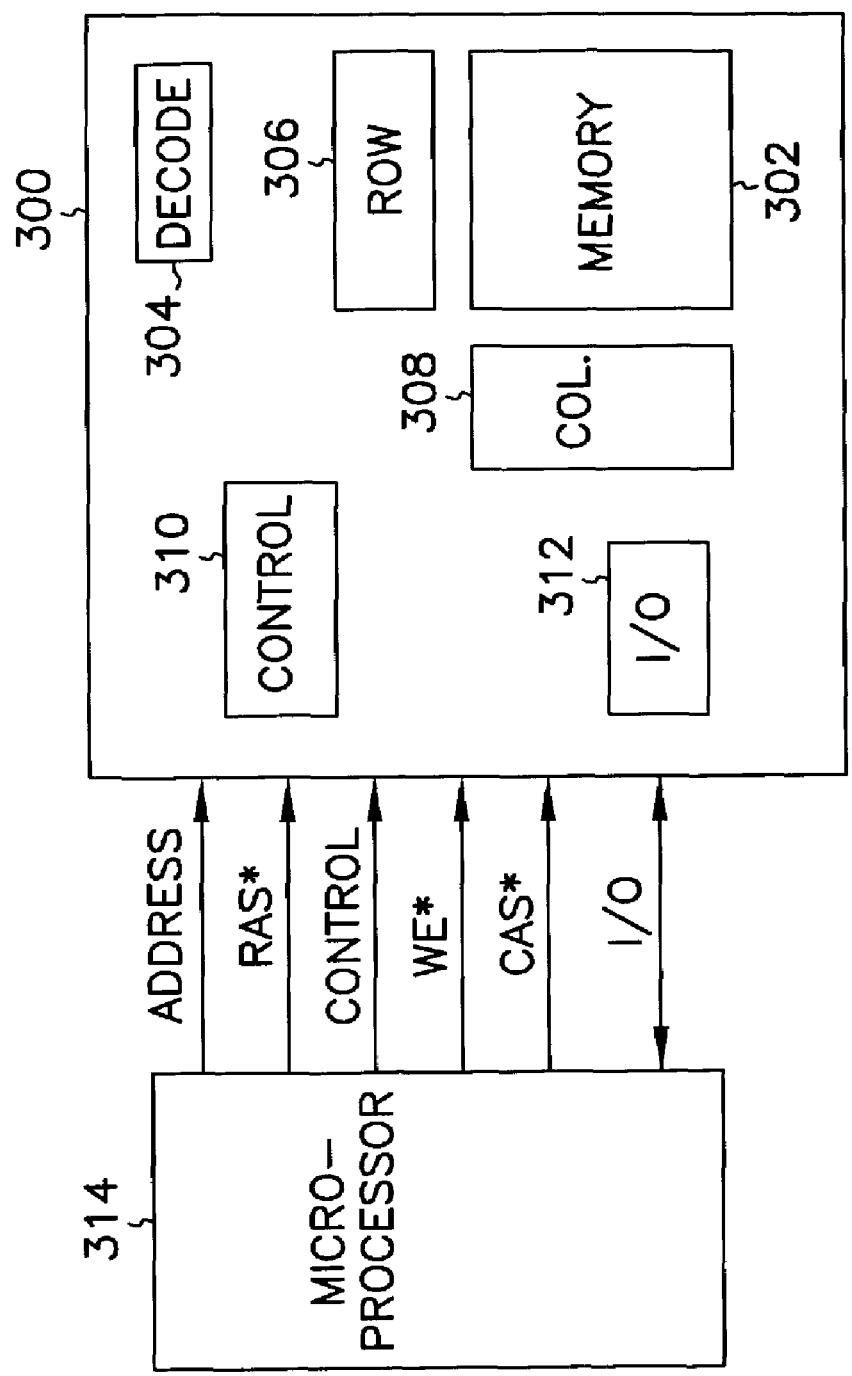
FIG. 3 is a block diagram of an integrated circuit memory device.

FIG. 3 is a simplified block diagram of a memory device according to one embodiment of the invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, RAS* and CAS* signals. The memory is used to store data which is accessed via I/O lines. It will be appreciated by those skilled in the art that additional circuitry and control signals can be provided, and that the memory device of FIG. 3 has been simplified to help focus on the invention. At least one of the memory cells or associated circuitry has a capacitor in accordance with the present invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is known in the art.

Semiconductor Dies

Figure 4:
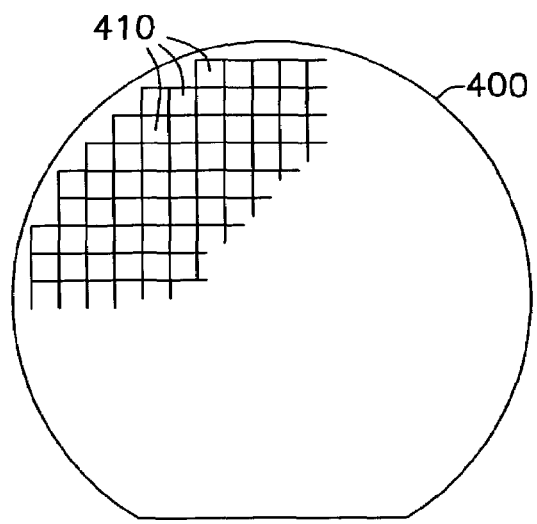
FIG. 4 is an elevation view of a wafer containing semiconductor dies.

With reference to FIG. 4, for one embodiment, a semiconductor die 410 is produced from a wafer 400. A die is an individual pattern, typically rectangular, on a substrate that contains circuitry, or integrated circuit devices, to perform a specific function. A semiconductor wafer will typically contain a repeated pattern of such dies containing the same functionality. Die 410 may contain circuitry for the inventive memory device, as discussed above. Die 410 may further contain additional circuitry to extend to such complex devices as a monolithic processor with multiple functionality. Die 410 is typically packaged in a protective casing (not shown) with leads extending therefrom (not shown) providing access to the circuitry of the die for unilateral or bilateral communication and control. Each die 410 may contain at least one of the capacitors according to the present invention.

Circuit Modules

Figure 5:
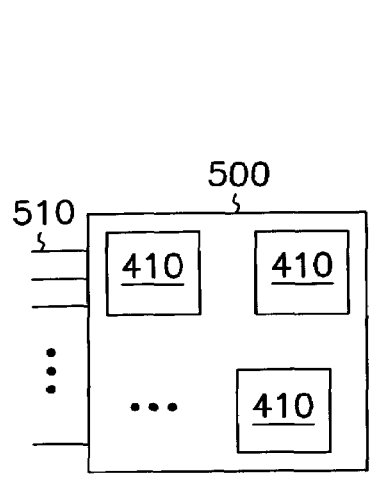
FIG. 5 is a block diagram of a circuit module.

As shown in FIG. 5, two or more dies 410 may be combined, with or without protective casing, into a circuit module 500 to enhance or extend the functionality of an individual die 410. Circuit module 500 may be a combination of dies 410 representing a variety of functions, or a combination of dies 410 containing the same functionality. One or more dies 410 of circuit module 500 contain at least one capacitor in accordance with the invention.

Some examples of a circuit module include memory modules, device drivers, power modules, communication modems, processor modules and application-specific modules, and may include multilayer, multichip modules. Circuit module 500 may be a subcomponent of a variety of electronic systems, such as a clock, a television, a cell phone, a personal computer, an automobile, an industrial control system, an aircraft and others. Circuit module 500 will have a variety of leads 410 extending therefrom and coupled to the dies 410 providing unilateral or bilateral communication and control.

Figure 6:
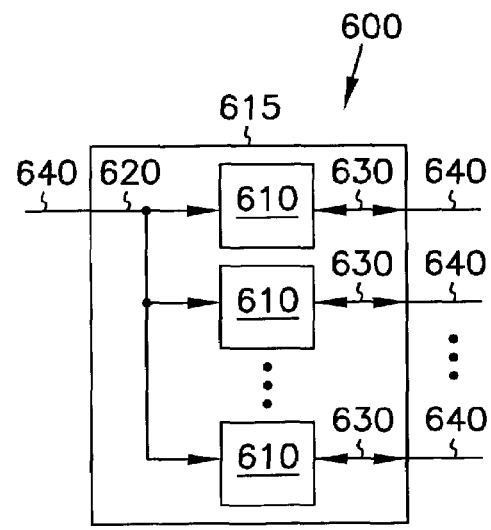
FIG. 6 is a block diagram of a memory module.

FIG. 6 shows one embodiment of a circuit module as memory module 600. Memory module 600 contains multiple memory devices 610 contained on support 615, the number generally depending upon the desired bus width and the desire for parity. Memory module 600 accepts a command signal from an external controller (not shown) on a command link 620 and provides for data input and data output on data links 630. The command link 620 and data links 630 are connected to leads 640 extending from the support 615. Leads 640 are shown for conceptual purposes and are not limited to the positions shown in FIG. 6. At least one of the memory devices 610 contains a capacitor according to the present invention.

Electronic Systems

Figure 7:
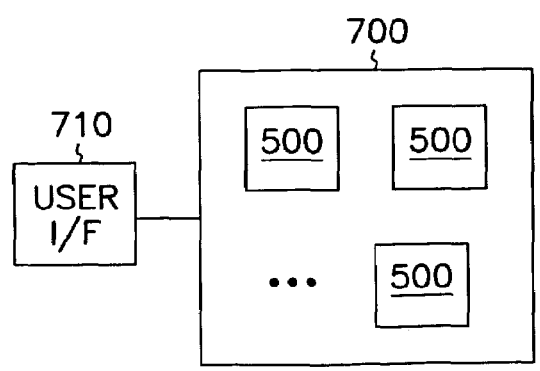
FIG. 7 is a block diagram of a electronic system.

FIG. 7 shows one embodiment of an electronic system 700 containing one or more circuit modules 500. Electronic system 700 generally contains a user interface 710. User interface 710 provides a user of the electronic system 700 with some form of control or observation of the results of the electronic system 700. Some examples of user interface 710 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 710 may further describe access ports provided to electronic system 700. Access ports are used to connect an electronic system to the more tangible user interface components previously exemplified. One or more of the circuit modules 500 may be a processor providing some form of manipulation, control or direction of inputs from or outputs to user interface 710, or of other information either preprogrammed into, or otherwise provided to, electronic system 700. As will be apparent from the lists of examples previously given, electronic system 700 will often be associated with certain mechanical components (not shown) in addition to circuit modules 500 and user interface 710. It will be appreciated that the one or more circuit modules 500 in electronic system 700 can be replaced by a single integrated circuit. Furthermore, electronic system 700 may be a subcomponent of a larger electronic system. It will also be appreciated that at least one of the memory modules 500 contains a capacitor according to the present invention.

Figure 8:
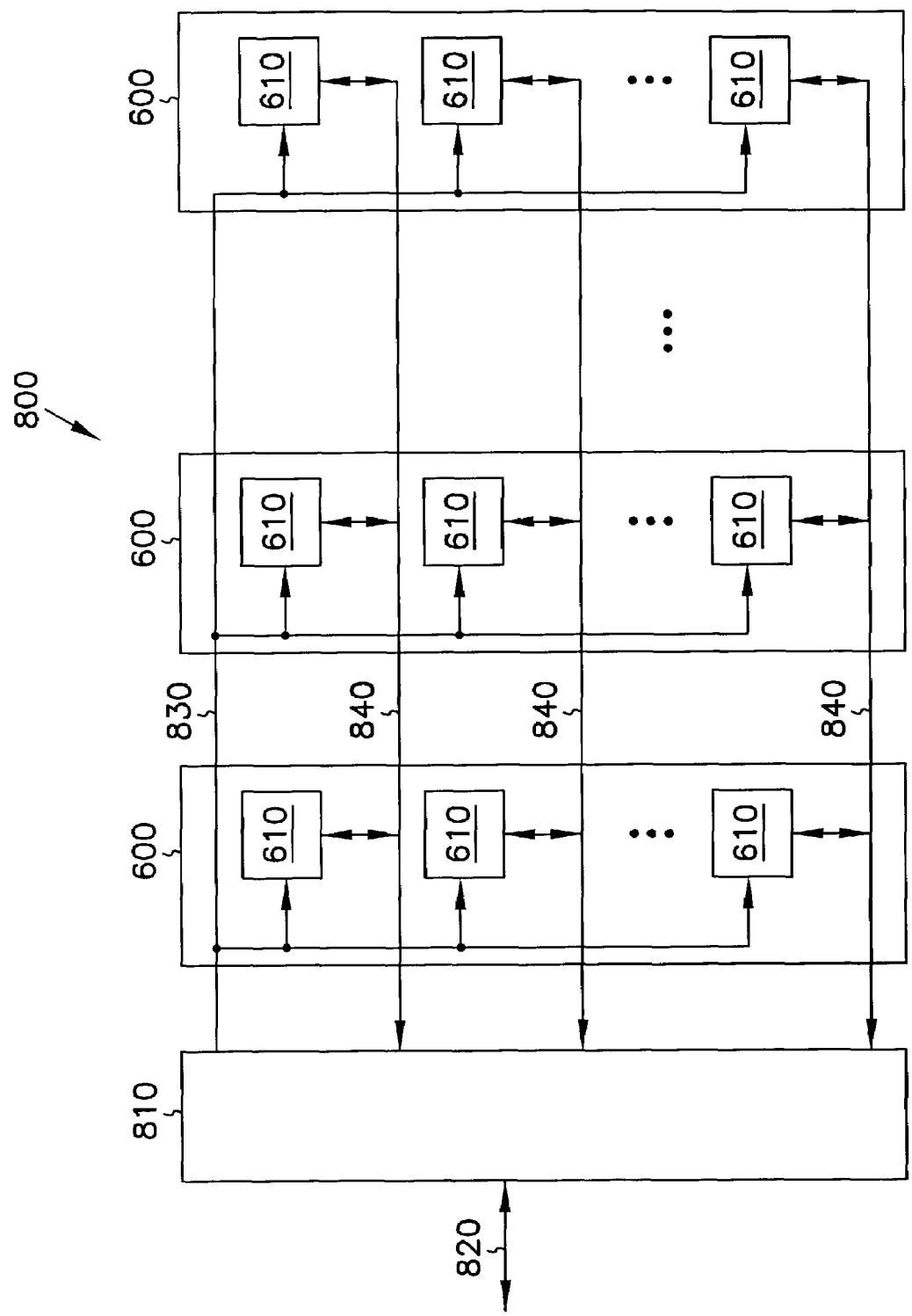
FIG. 8 is a block diagram of a memory system.

FIG. 8 shows one embodiment of an electronic system as memory system 800. Memory system 800 contains one or more memory modules 600 and a memory controller 810. The memory modules 600 each contain one or more memory devices 610. At least one of memory devices 610 contain a capacitor according to the present invention. Memory controller 810 provides and controls a bidirectional interface between memory system 800 and an external system bus 820. Memory system 800 accepts a command signal from the external bus 820 and relays it to the one or more memory modules 600 on a command link 830. Memory system 800 provides for data input and data output between the one or more memory modules 600 and external system bus 820 on data links 840. It will also be appreciated that at least one of the memory modules 600 contains a capacitor according to the present invention.

Figure 9:
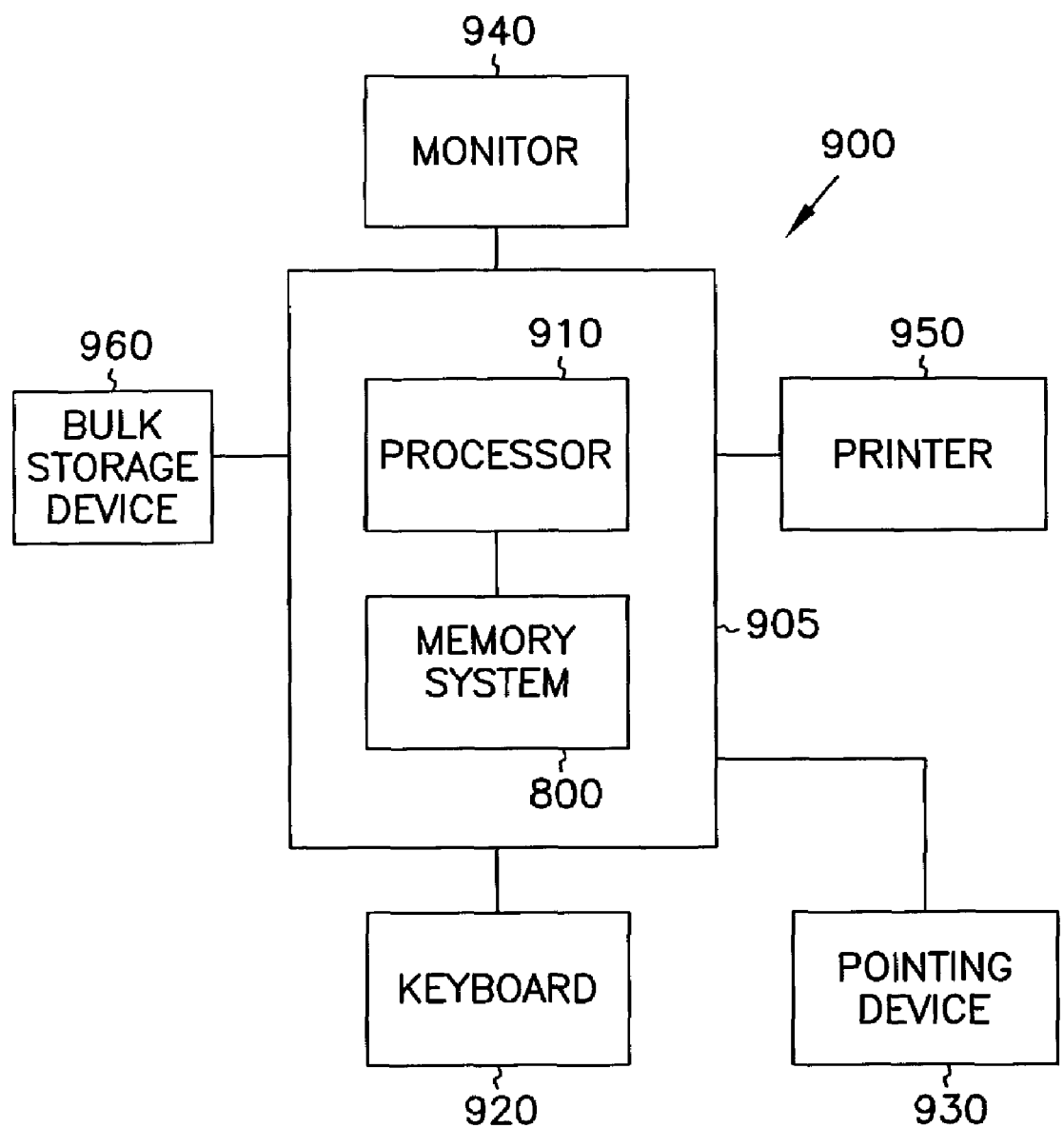
FIG. 9 is a block diagram of a computer system.

FIG. 9 shows a further embodiment of an electronic system as a computer system 900. Computer system 900 contains a processor 910 and a memory system 800 housed in a computer unit 905. Computer system 900 is but one example of an electronic system containing another electronic system, i.e., memory system 800, as a subcomponent. Computer system 900 optionally contains user interface components. Depicted in FIG. 9 are a keyboard 1220, a pointing device 930, a monitor 940, a printer 950 and a bulk storage device 960. It will be appreciated that other components are often associated with computer system 900 such as modems, device driver cards, additional storage devices, etc. It will further be appreciated that the processor 910 and memory system 800 of computer system 900 can be incorporated on a single integrated circuit. Such single package processing units reduce the communication time between the processor and the memory circuit. It will be appreciated that at least one of the processor 910 and memory system 800 contain a capacitor according to the present invention.

Test Results

Figure 10:
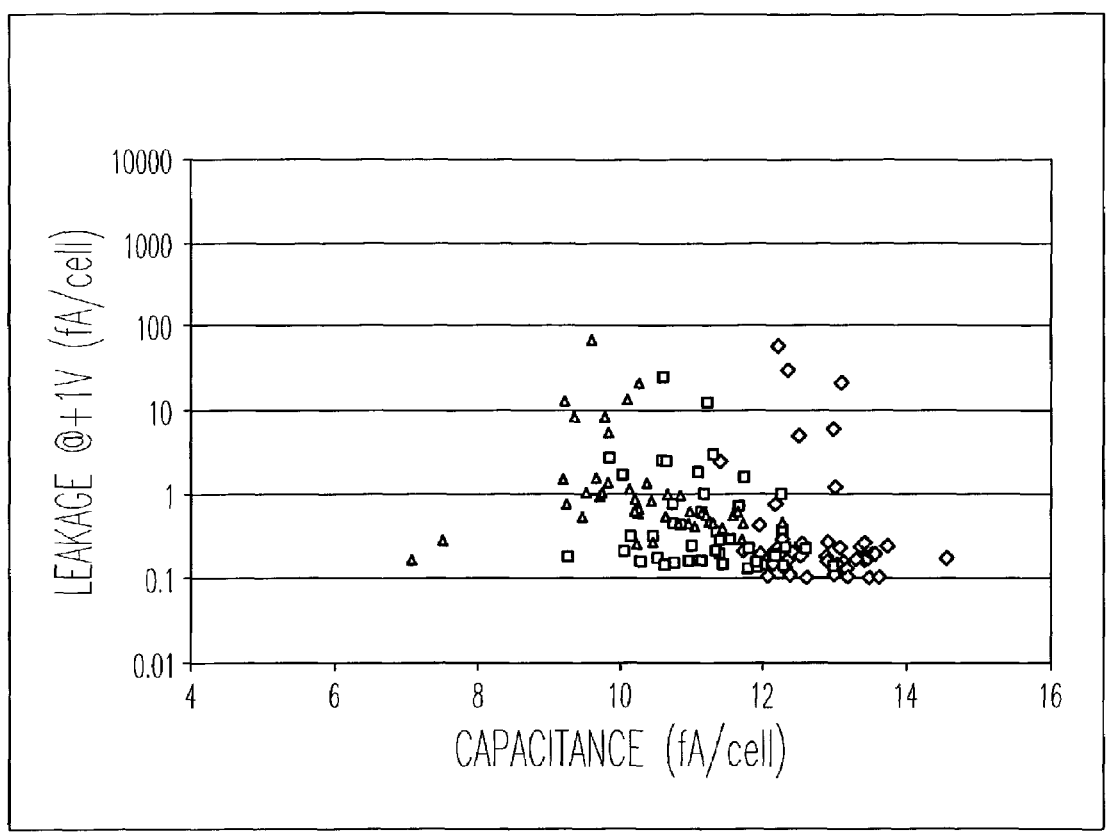
FIG. 10 is a graph of capacitor leakage versus capacitance for three different annealing temperatures.
Figure 11:
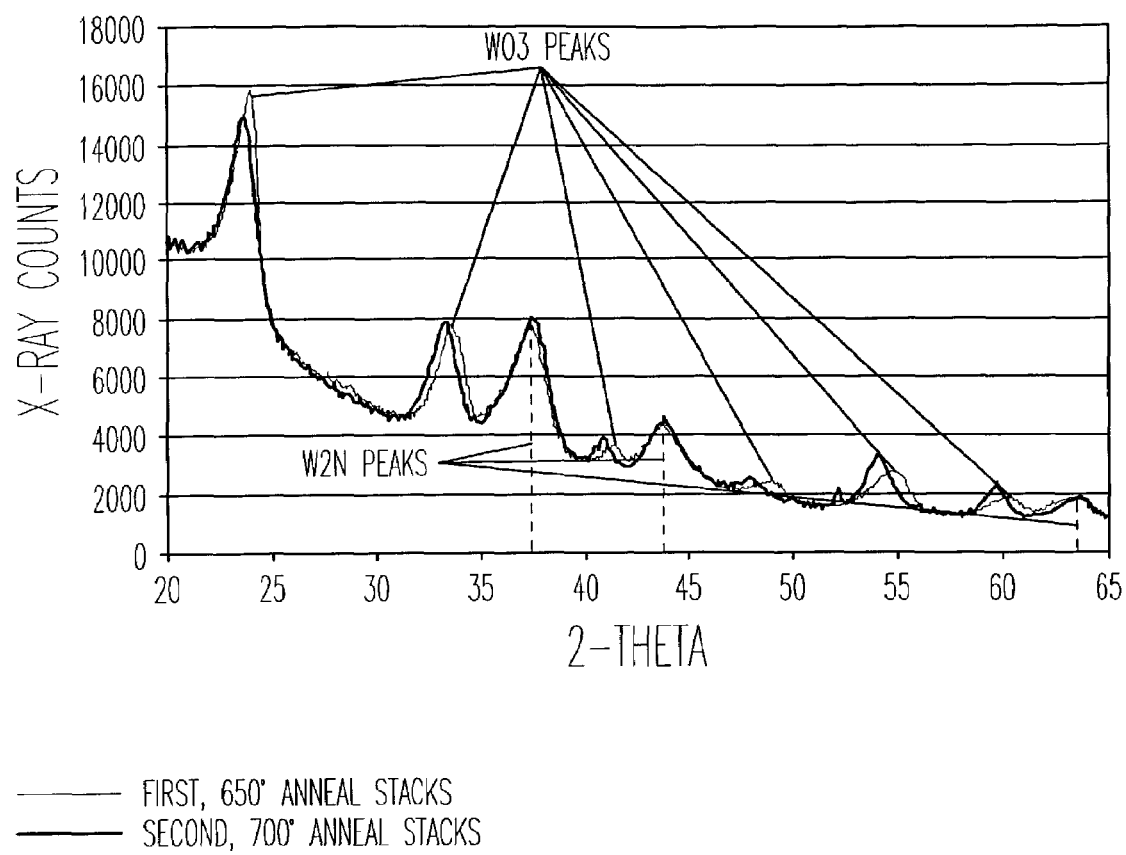
FIG. 11 is an X-ray diffraction spectra of $O_3$ annealed $WN_x$ at different temperatures.
Figure 12:
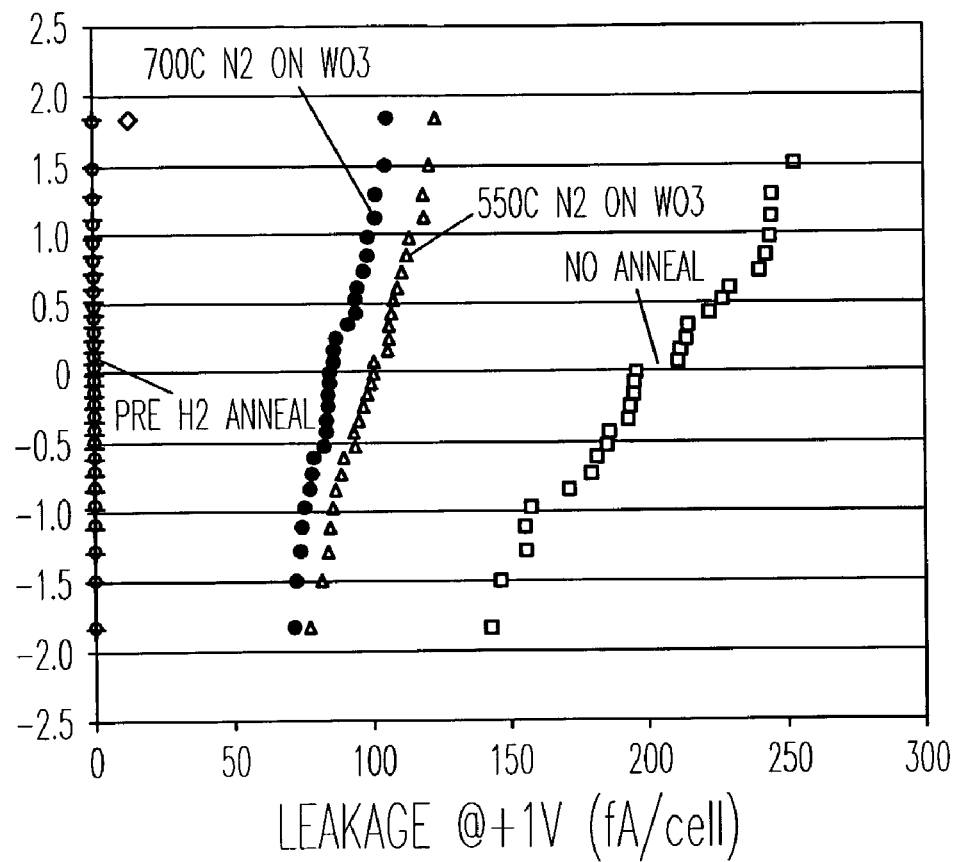
FIG. 12 is a graph of the impact of backend annealing in $H_2$ on performance of a capacitor according to the present invention.

FIGS. 10-12 show results from various test wafers. The test wafers all include a deep container, high-k MIM capacitor formed of a $WN_x$ bottom electrode deposited by CVD on a substrate, an 80 Å $Ta_2O_5$ dielectric layer deposited by CVD, and a Pt—Rh alloy top electrode also deposited by CVD. A buffer layer is formed by oxidizing the $WN_x$ bottom electrode prior to depositing the dielectric layer. The test wafers were oxidized in an $O_3$ ambient at 475 degrees Celsius for three minutes. The buffer layer comprises a $WO_3$ layer and the bottom electrode includes a $W_2N$ layer adjacent the buffer layer. After creation of the $WO_3$ buffer layer and before depositing the dielectric layer, the buffer layer/bottom electrode stack is annealed in an $N_2$ ambient for one minute at various temperatures ranging from 500 to 700 degrees Celsius. The dielectric layer is deposited at 475 degrees Celsius in an O$_2$ ambient. The Pt—Rh alloy top electrode is deposited according to techniques known to those of skill in the art.

FIG. 10 shows capacitance and leakage measurements from three wafers having a plurality of MIM container capacitors. All capacitors were created according to the above method with the WO$_3$ buffer layers and adjacent electrodes on each wafer being annealed at various temperatures. Test capacitors 1 (denoted as Δ) were created by annealing the WO$_3$ buffer layer/electrode stack at a temperature of 500 degrees Celsius. Test capacitors 2 (denoted as □) were created by annealing the WO$_3$ buffer layer/electrode stack at a temperature of 600 degrees Celsius. Test capacitors 3 (denoted as ◆) were created by annealing the WO$_3$ buffer layer/electrode stack at a temperature of 700 degrees Celsius. As evident from the plotted data points representing leakage and capacitance, the higher temperature anneal represented by the test capacitors 3 (denoted as ◆) yields higher capacitance and lower leakage relative to the lower temperature anneal represented by test capacitors 1 and 2 (respectively denoted by Δ and □).

FIG. 11 shows an X-ray diffraction spectra of two WO$_3$ buffer layer samples. The lighter line represents a first sample which was annealed at a temperature of 650 degrees Celsius. The darker data line represents a second sample which was annealed at a temperature of 700 degrees Celsius. Both stacks were annealed in an N$_2$ ambient for one minute. The graph further indicates the peaks of the W$_2$N layer of the bottom, adjacent electrode. It is noted that the peaks of the W$_2$N layer samples do not shift for the two annealing temperatures. The spectra shows that the WO$_3$ peaks of the 700 degree annealed, second stack shift toward a lower 2-theta angle than the WO$_3$ peaks of the 650 degree annealed, first stack. The shift was about 0.5 to 1 degree. As a result, it is identified that the 700 degree annealed buffer layer has an orthorhomic crystal structure, while the 650 degree annealed buffer layer has a monoclinic crystal structure. Orthorhomic structures are more stable at higher temperatures than monoclinic structures.

Shifts in 2-theta angle can at times be attributed to film stress. However, the shift shown in FIG. 11 is believed to not be caused by film stress as the W$_2$N peaks did not shift as a function of the different anneal temperatures.

In one embodiment, the anneal temperature of the buffer layer/electrode stack is about 700 degrees Celsius. As discussed in conjunction with the test results, a higher anneal temperature of the buffer layer yields a capacitor with higher capacitance and lower leakage. It is believed that the high temperature anneal (at about, or greater than, 700 degrees Celsius) changes the phase of the WO$_3$ lattice structure from a monoclinic crystalline structure to an orthorhomic crystalline structure, which is more stable than monoclinic lattice structures at higher temperatures.

Figure 21:
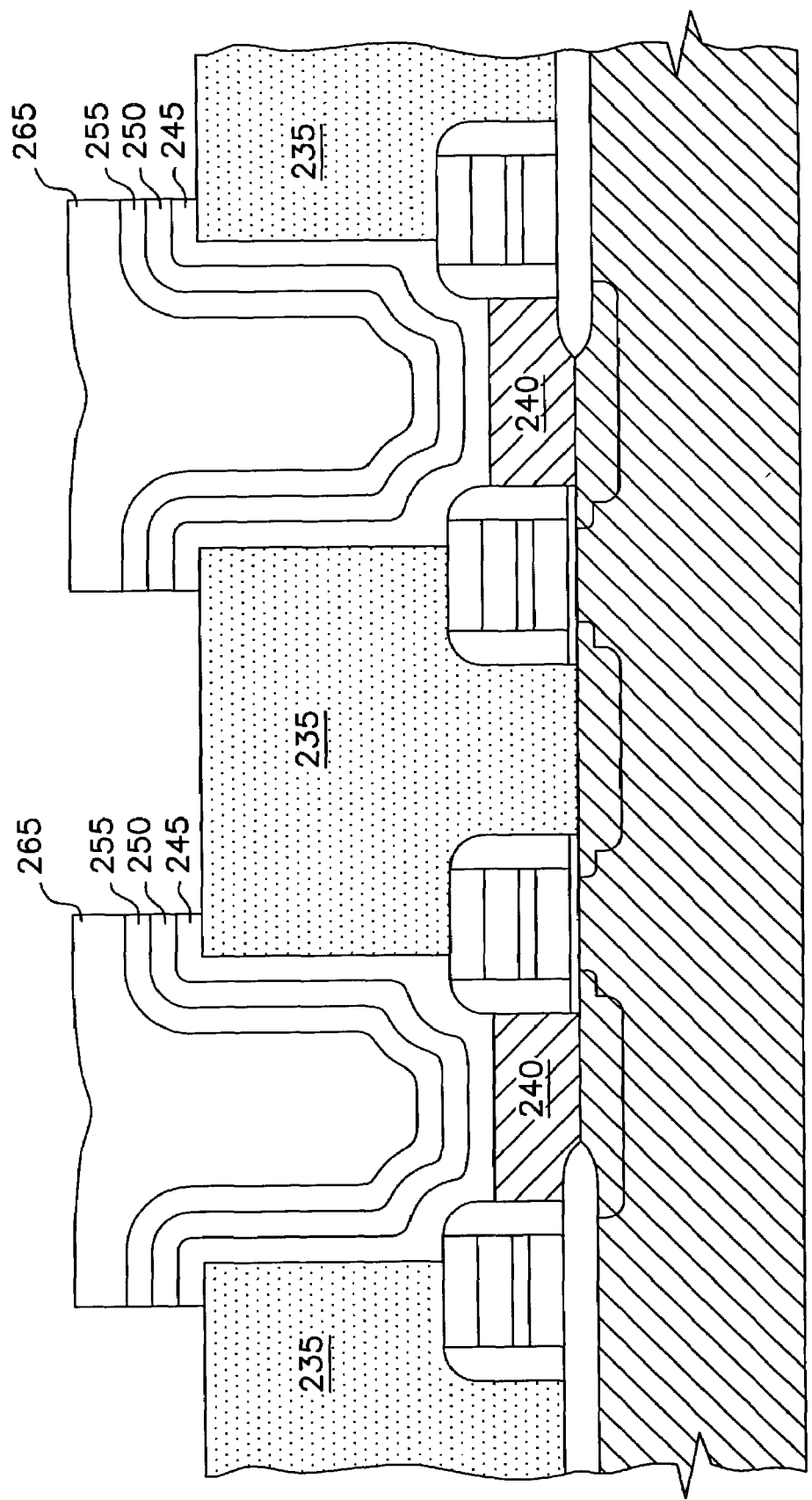

FIG. 12 graphically shows the effect of backend wafer processing on capacitor leakage. Integrated circuits that include transistors are sometimes subjected to backend processing which improves the reliability of the structures. Backend processing typically includes annealing the wafer in a hydrogen ambient, for example in an ambient of 10% hydrogen and 90% nitrogen. Such backend processing results in a more robust interface for the transistors. The sets of capacitors denoted by ◇, +, and ○ were not subjected to backend processing. The sets of capacitors denoted by □, Δ, and • were respectively fabricated in the same manner as sets of capacitors ◇, +, and ○ and then were subject to backend processing. All of the capacitors ◇, +, ○, □, Δ, and • have a structure as shown in FIG. 21. The sets of capacitors denoted by ○ and • had their bottom electrodes and buffer layers annealed at 750 degrees Celsius. The sets of capacitors denoted by + and Δ had their bottom electrodes and buffer layers annealed at 550 degrees Celsius. The sets of capacitors denoted by ◇ and □ did not anneal their bottom electrodes and buffer layers.

As shown in the graph of FIG. 12, the leakage of the capacitors which were not subject to backend processing is less than those capacitors which were subject to backend processing. But annealing the bottom electrode and buffer layer did reduce the leakage compared to not annealing. More specifically, the median leakage of capacitors •, which were annealed at 750 degrees Celsius, is about 70 fA. Whereas the median leakages for capacitors Δ and capacitors □, which were respectively annealed at 550 degrees Celsius and not annealed, are about 100 fA and 200 fA, respectively. Accordingly, the high temperature anneal of the buffer layer 250 and bottom electrode 245 resulted in capacitors which have less leakage than those annealed at lower temperatures or not annealed. It is believed that the capacitors which are subjected to the high temperature anneal (greater than 700 degrees Celsius, and in one embodiment at about 750 degrees Celsius) are more stable and thus less effected by the backend hydrogen anneal processing.

The other capacitors (denoted by ◇, +, and ○) not subject to backend processing have a leakage which is less than the leakage of the capacitors subjected to backend processing. While not visible on the scale of FIG. 12, these capacitors follow the above findings that the capacitor with a buffer layer according to the present invention which is subject to a high temperature anneal has less leakage than the capacitors which were not subject to a high temperature anneal.

It is foreseen that the present invention can be practiced with or without the backend processing. For example, it is possible to create the transistors on a wafer and then subject same to backend processing prior to creating the capacitors according to the present invention, e.g. capacitor over digit line structures.

While the invention has been described and illustrated with respect to forming container capacitors for a memory cell, it should be apparent that substantially similar processing techniques can be used to form other container capacitors for other applications as well as other capacitor structures. As one example, capacitors formed in accordance with the methods described herein may be used as on-chip capacitors utilized to reduce lead impedance of a packaged integrated circuit chip. As further example, parallel plate or trench capacitors may be formed with a metal oxide barrier layer between a dielectric layer and an electrode.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other materials and shapes, as well as other deposition and removal processes, may be utilized in conjunction with the invention. Accordingly, this application is intended to cover any adaptations or variations of the invention. It is manifestly intended that this invention be limited only by the following claims and equivalents thereof.

CONCLUSION

Capacitor structures and methods of their manufacture have been described for use in integrated circuits. The capacitor structures include two electrodes and a dielectric layer interposed between the two electrodes. The capacitor structures further include a metal oxide buffer layer interposed between the dielectric layer and one of the electrodes. The metal oxide buffer layer acts to reduce leakage and yield higher capacitance. The capacitors are suited for use in memory cells and apparatus incorporating such memory cells, as well as in other integrated circuits.

What is claimed is:

1. A method of forming a capacitor, comprising:
   forming a bottom electrode layer that includes tungsten;
   forming a tungsten oxide buffer layer overlying the bottom electrode layer, including annealing the tungsten oxide buffer layer at a temperature of at least 700 degrees Celsius to form an orthorhombic crystal structure;
   forming a dielectric layer directly on the tungsten oxide buffer layer; and
   forming a top electrode layer overlying the dielectric layer.

2. The method of claim 1, further comprising patterning the top electrode layer, the buffer layer, the dielectric layer, and the bottom electrode layer to define the capacitor.

3. The method of claim 1, wherein the method is performed in the order presented.

4. A method of forming a capacitor, comprising:
   forming a bottom electrode layer, including tungsten, on a substrate;
   oxidizing the bottom electrode layer to form a tungsten oxide buffer layer overlying the bottom electrode layer, and annealing the tungsten oxide buffer layer at a temperature of at least 700 degrees Celsius;
   forming an orthorhombic crystal structure;
   forming a dielectric layer directly on the tungsten oxide buffer layer; and
   forming a top electrode layer overlying the dielectric layer.

5. The method of claim 4, wherein the method is performed in the order presented.

6. A method of forming a capacitor, comprising:
   forming a bottom electrode layer, which includes tungsten, on a substrate;
   oxidizing the bottom electrode layer to form a tungsten oxide buffer layer overlying the bottom electrode layer;
   annealing the tungsten oxide buffer layer at a temperature of about 750 degrees Celsius, wherein the annealing includes converting the tungsten oxide buffer layer to an orthorhombic crystal structure;
   forming a dielectric layer directly on the tungsten oxide buffer layer; and
   forming a top electrode layer overlying the dielectric layer.

7. The method of claim 6, wherein the method is performed in the order presented.

8. The method of claim 7, wherein the bottom electrode is deposited by chemical vapor deposition, and the top electrode is deposited by chemical vapor deposition.

9. The method of claim 6, wherein the dielectric layer is formed to a thickness of about 80 Å.

10. A method of forming a capacitor, comprising:
    forming a bottom electrode layer, which includes tungsten, on a substrate;
    oxidizing the bottom electrode layer to form a metal oxide buffer layer overlying the bottom electrode layer;
    annealing the buffer layer at about 700 degrees Celsius;
    converting a monoclinic crystalline structure to an orthorhombic crystalline structure;
    forming a dielectric layer directly on the metal oxide buffer layer; and
    forming a top electrode layer overlying the dielectric layer.

11. The method of claim 10, wherein the buffer layer is annealed for about one minute.

12. The method of claim 10, wherein the buffer layer is annealed in an $N_2$ ambient.

13. A method of forming a capacitor, comprising:
    forming a first electrode layer;
    forming a second electrode layer, wherein at least one of the first electrode layer and the second electrode layer includes tungsten;
    forming a dielectric layer interposed between the first electrode layer and the second electrode layer; and
    forming a tungsten oxide buffer layer in direct contact with the dielectric layer and one of the first and second electrode layers, and annealing the tungsten oxide buffer layer at a temperature of at least 700 degrees Celsius and including forming an orthorhombic crystal lattice from a monoclinic crystal lattice.

14. The method of claim 13, wherein forming the tungsten oxide buffer layer includes oxidizing the one of the first and second electrode layers to form the tungsten oxide buffer layer before annealing the tungsten oxide buffer layer.

15. A method of forming a capacitor, comprising:
    forming a bottom electrode layer;
    forming an orthorhombic crystal structured buffer layer overlying the bottom electrode layer and wherein forming the orthorhombic crystal structured buffer layer includes annealing at a temperature greater than 700 degrees C;
    forming a dielectric layer overlying the buffer layer; and
    forming a top electrode layer overlying the dielectric layer.

16. The method of claim 15, further comprising patterning the top electrode layer, the buffer layer, the dielectric layer, and the bottom electrode layer to define the capacitor.

17. The method of claim 15, wherein the method is performed in the order presented.

18. A method of forming a capacitor, comprising:
    forming a bottom electrode layer;
    forming a metal oxide buffer layer overlying the bottom electrode layer;
    annealing the metal oxide buffer layer at a temperature of at least 700 degrees C, wherein annealing includes forming at least a portion of an orthorhombic crystal structure;
    forming a single compound, dielectric layer directly on the buffer layer, the dielectric layer having a dielectric constant less than a dielectric constant of the buffer layer; and
    forming a top electrode layer overlying the dielectric layer.

19. The method of claim 18, further comprising patterning the top electrode layer, the buffer layer, the dielectric layer, and the bottom electrode layer to define the capacitor.

20. The method of claim 18, wherein the method is performed in the order presented.

21. A method of forming a capacitor, comprising:
    forming a bottom electrode layer;
    annealing the bottom electrode layer;
    forming a metal oxide buffer layer overlying the bottom electrode layer;
    annealing the buffer layer at a temperature of at least 700 degrees Celsius;

converting a monoclinic crystal lattice to an orthorhombic crystal structure;
forming a dielectric layer directly on the metal oxide buffer layer; and
forming a top electrode layer overlying the dielectric layer.

22. The method of claim 21, further comprising patterning the top electrode layer, the buffer layer, the dielectric layer, and the bottom electrode layer to define the capacitor.

23. The method of claim 22, wherein the method is performed in the order presented.

24. A method of forming a capacitor, comprising:
forming a bottom electrode layer that includes tungsten;
forming a tungsten oxide buffer layer overlying the bottom electrode layer, wherein the forming includes placing the dielectric layer in an inert gas heated to at least 700 degrees Celsius, and wherein the tungsten oxide buffer layer includes at least a portion of a monoclinic crystal lattice;
converting the at least a portion of monoclinic crystal lattice to at least a portion of an orthorhombic crystal structure;
forming a dielectric layer directly on the tungsten oxide buffer layer; and
forming a top electrode layer overlying the dielectric layer, wherein forming a dielectric layer includes depositing a $Ta_2O_5$ layer.

25. The method of claim 1, wherein forming the bottom electrode layer comprises forming a layer of tungsten nitride.

26. The method of claim 10, wherein forming the bottom electrode layer comprises forming a layer of tungsten nitride; and wherein oxidizing the bottom electrode layer includes forming a tungsten oxide layer.

27. The method of claim 26, wherein forming a dielectric layer includes depositing a $Ta_2O_5$ layer.

28. The method of claim 15, wherein forming a bottom electrode layer includes forming a tungsten nitride bottom electrode layer, and wherein forming a buffer layer includes oxidizing the tungsten nitride bottom electrode layer to form a tungsten trioxide buffer layer.

29. The method of claim 18, wherein forming a dielectric layer includes depositing a $Ta_2O_5$ layer, wherein forming a bottom electrode layer includes forming a tungsten nitride bottom electrode layer, and wherein forming a metal oxide buffer layer includes oxidizing the tungsten nitride bottom electrode layer to form a tungsten trioxide buffer layer.

30. A method of forming a capacitor, comprising:
forming a bottom electrode layer, the bottom electrode layer including a metal material;
forming a buffer layer directly contacting the bottom electrode layer, the buffer layer including a metal oxide material, and the buffer layer having orthorhombic crystal structure;
annealing the buffer layer at about 700 degrees Celsius, wherein annealing includes changing the crystal lattice from a monoclinic crystalline form to an orthorhombic crystalline form;
forming a dielectric layer directly contacting the buffer layer, and the dielectric layer having a dielectric constant less than a dielectric constant of the buffer layer; and
forming a top electrode layer directly contacting the dielectric layer.

31. A method of forming a capacitor, comprising:
forming a bottom electrode layer, the bottom electrode including tungsten;
forming a buffer layer directly contacting the bottom electrode layer, the buffer layer including tungsten oxide;
annealing the buffer layer in an $N_2$ ambient at a temperature of at least 700 degrees Celsius;
changing a monoclinic crystalline structure to an orthorhombic crystalline form;
forming a dielectric layer directly contacting the buffer layer, and the dielectric layer having a dielectric constant less than a dielectric constant of the buffer layer; and
forming a top electrode layer directly contacting the dielectric layer.

32. The method of claim 1, wherein forming a tungsten oxide buffer layer includes forming a buffer layer having a leakage current less than $100 \times 10^{-15}$ Amperes per capacitive cell.

33. The method of claim 1, wherein forming a tungsten oxide buffer layer includes forming a buffer layer having a capacitance greater than $7 \times 10^{-15}$ Farads per capacitive cell.

34. The method of claim 1, wherein forming a bottom electrode includes forming a bottom electrode tat is about 5 times the thickness of the dielectric layer.

35. The method of claim 1, wherein forming a bottom electrode layer includes forming a bottom electrode comprising $WN_n$ with $0<n<=6$.

36. The method of claim 1, wherein forming a bottom electrode layer includes forming a bottom electrode comprising $W_2N$.

37. The method of claim 4, wherein forming an orthorhombic crystal structure includes forming an orthorhombic crystal structure having a leakage current less than $100 \times 10_{-15}$ Amperes per capacitor.

38. The method of claim 36, wherein forming an orthorhombic crystal structure includes forming an orthorhombic crystal structure having a capacitance of at least $7 \times 10_{-15}$ Farads per capacitor.

* * * * *

UNITED STATES PATENT AND TRADEMARK OFFICE
CERTIFICATE OF CORRECTION

PATENT NO. : 7,368,343 B2 Page 1 of 1
APPLICATION NO. : 10/215462
DATED : May 6, 2008
INVENTOR(S) : Yang It is certified that error appears in the above-identified patent and that said Letters Patent is hereby corrected as shown below:

In column 16, line 36, in Claim 34, delete "tat" and insert -- that --, therefor.

In column 16, line 48, in Claim 37, delete "$10_{-15}$" and insert -- $10^{-15}$ --, therefor.

In column 16, line 51, in Claim 38, delete "$10_{-15}$" and insert -- $10^{-15}$ --, therefor.

Signed and Sealed this

Nineteenth Day of August, 2008

JON W. DUDAS
*Director of the United States Patent and Trademark Office*